US007003752B2

(12) United States Patent
Teig et al.

(10) Patent No.: US 7,003,752 B2
(45) Date of Patent: Feb. 21, 2006

(54) METHOD AND APPARATUS FOR ROUTING

(75) Inventors: Steven Teig, Menlo Park, CA (US); Jonathan Frankle, Los Gatos, CA (US); Etienne Jacques, Sunnyvale, CA (US); Andrew Caldwell, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 252 days.

(21) Appl. No.: 10/335,093

(22) Filed: Dec. 31, 2002

(65) Prior Publication Data

US 2004/0098696 A1    May 20, 2004

Related U.S. Application Data

(60) Provisional application No. 60/427,131, filed on Nov. 18, 2002.

(51) Int. Cl.
G06F 17/50    (2006.01)
(52) U.S. Cl. .............................. 716/12; 716/13; 716/7
(58) Field of Classification Search .............. 716/1–18
See application file for complete search history.

(56) References Cited

U.S. PATENT DOCUMENTS

| | | | |
|---|---|---|---|
| 4,593,363 A | 6/1986 | Burstein et al. | |
| 4,615,011 A | 9/1986 | Linsker | |
| 4,673,966 A | 6/1987 | Shimoyama | |
| 4,777,606 A | 10/1988 | Fournier | |
| 4,782,193 A | 11/1988 | Linsker | |
| 4,855,929 A | 8/1989 | Nakajima | |
| 5,097,422 A | 3/1992 | Corbin, II et al. | |
| 5,224,057 A | 6/1993 | Igarashi et al. | |
| 5,251,147 A | 10/1993 | Finnerty | |
| 5,267,176 A | 11/1993 | Antreich et al. | |
| 5,281,151 A | 1/1994 | Arima et al. | |
| 5,360,948 A | 11/1994 | Thornberg | |
| 5,375,069 A | 12/1994 | Satoh et al. | |
| 5,519,836 A | 5/1996 | Gawlick | |
| 5,532,934 A | 7/1996 | Rostoker | |
| 5,566,078 A | 10/1996 | Ding et al. | |
| 5,578,840 A * | 11/1996 | Scepanovic et al. | ........ 257/207 |
| 5,587,923 A | 12/1996 | Wang | |
| 5,618,744 A | 4/1997 | Suzuki et al. | |

(Continued)

FOREIGN PATENT DOCUMENTS

JP    64-015947    1/1989

(Continued)

OTHER PUBLICATIONS

Das et al., "Channel Routing in Manhattan-Diagonal Model," IEEE, Jan. 1996, pp. 43-48.*

(Continued)

*Primary Examiner*—Matthew Smith
*Assistant Examiner*—Binh Tat
(74) *Attorney, Agent, or Firm*—Stattler, Johansen & Adeli LLP

(57) ABSTRACT

Some embodiments of the invention provide a method of routing nets in a region of a layout with multiple layers. The method defines a routing graph that has several of nodes on plurality of layers, where each node represents a sub-region on a layer. In the graph, there is a set of edges between the nodes on each layer. On one layer, there is at least one set of edges that are neither orthogonal nor parallel to a set of edges on another layer. The method uses this routing graph to identify routes.

30 Claims, 13 Drawing Sheets

U.S. PATENT DOCUMENTS

| | | |
|---|---|---|
| 5,633,479 A | 5/1997 | Hirano |
| 5,634,093 A | 5/1997 | Ashida et al. |
| 5,635,736 A | 6/1997 | Funaki et al. |
| 5,636,125 A | 6/1997 | Rostoker et al. |
| 5,637,920 A | 6/1997 | Loo |
| 5,640,327 A | 6/1997 | Ting |
| 5,650,653 A | 7/1997 | Rostoker et al. |
| 5,657,242 A | 8/1997 | Sekiyama et al. |
| 5,663,891 A | 9/1997 | Bamji et al. |
| 5,699,265 A | 12/1997 | Scepanovic et al. |
| 5,723,908 A | 3/1998 | Fuchida et al. |
| 5,742,086 A | 4/1998 | Rostoker et al. |
| 5,757,089 A | 5/1998 | Ishizuka |
| 5,757,656 A | 5/1998 | Hershberger et al. |
| 5,777,360 A | 7/1998 | Rostoker et al. |
| 5,784,289 A | 7/1998 | Wang |
| 5,798,936 A | 8/1998 | Cheng |
| 5,811,863 A | 9/1998 | Rostoker et al. |
| 5,822,214 A | 10/1998 | Rostoker et al. |
| 5,838,583 A | 11/1998 | Varadarajan et al. |
| 5,859,449 A | 1/1999 | Kobayashi et al. |
| 5,889,677 A | 3/1999 | Yasuda et al. |
| 5,898,597 A | 4/1999 | Scepanovic et al. |
| 5,914,887 A | 6/1999 | Scepanovic et al. |
| 5,973,376 A | 10/1999 | Rostoker et al. |
| 5,980,093 A | 11/1999 | Jones et al. |
| 6,035,108 A | 3/2000 | Kikuchi |
| 6,038,385 A | 3/2000 | Scepanovic et al. |
| 6,058,254 A * | 5/2000 | Scepanovic et al. ........... 716/2 |
| 6,067,409 A | 5/2000 | Scepanovic et al. |
| 6,068,662 A | 5/2000 | Scepanovic et al. |
| 6,070,108 A | 5/2000 | Andreev et al. |
| 6,088,519 A | 7/2000 | Koford |
| 6,123,736 A | 9/2000 | Pavisic et al. |
| 6,128,767 A | 10/2000 | Chapman |
| 6,134,702 A | 10/2000 | Scepanovic et al. |
| 6,150,193 A | 11/2000 | Glenn |
| 6,154,874 A | 11/2000 | Scepanovic et al. |
| 6,155,725 A | 12/2000 | Scepanovic et al. |
| 6,175,950 B1 | 1/2001 | Scepanovic et al. |
| 6,209,123 B1 | 3/2001 | Maziasz et al. |
| 6,216,252 B1 | 4/2001 | Dangelo et al. |
| 6,219,832 B1 | 4/2001 | Buzbee |
| 6,226,560 B1 | 5/2001 | Hama et al. |
| 6,230,306 B1 * | 5/2001 | Raspopovic et al. .......... 716/13 |
| 6,240,541 B1 | 5/2001 | Yasuda et al. |
| 6,247,167 B1 | 6/2001 | Raspopovic et al. |
| 6,249,902 B1 | 6/2001 | Igusa et al. |
| 6,253,363 B1 | 6/2001 | Gasanov et al. |
| 6,260,179 B1 | 7/2001 | Ohsawa et al. |
| 6,262,487 B1 | 7/2001 | Igarashi et al. |
| 6,289,495 B1 | 9/2001 | Raspopovic et al. |
| 6,295,634 B1 | 9/2001 | Matsumoto |
| 6,301,686 B1 | 10/2001 | Kikuchi et al. |
| 6,305,004 B1 * | 10/2001 | Tellez et al. .................. 716/12 |
| 6,307,256 B1 | 10/2001 | Chiang et al. |
| 6,316,838 B1 | 11/2001 | Ozawa et al. |
| 6,324,674 B1 | 11/2001 | Andreev et al. |
| 6,324,675 B1 | 11/2001 | Dutta et al. |
| 6,327,693 B1 | 12/2001 | Cheng et al. |
| 6,327,694 B1 | 12/2001 | Kanazawa |
| 6,330,707 B1 | 12/2001 | Shinomiya et al. |
| 6,349,403 B1 | 2/2002 | Dutta et al. |
| 6,366,279 B1 | 4/2002 | Gorman |
| 6,378,121 B1 | 4/2002 | Hiraga |
| 6,385,758 B1 | 5/2002 | Kikuchi et al. |
| 6,401,234 B1 | 6/2002 | Alpert et al. |
| 6,405,358 B1 | 6/2002 | Nuber |
| 6,407,434 B1 | 6/2002 | Rostoker et al. |
| 6,412,097 B1 | 6/2002 | Kikuchi et al. |
| 6,412,102 B1 | 6/2002 | Andreev et al. |
| 6,415,422 B1 | 7/2002 | Mehrotra et al. |
| 6,436,804 B1 | 8/2002 | Igarashi et al. |
| 6,442,743 B1 | 8/2002 | Sarrafzadeh et al. |
| 6,442,745 B1 | 8/2002 | Arunachalam et al. |
| 6,446,245 B1 | 9/2002 | Xing et al. |
| 6,448,591 B1 | 9/2002 | Juengling |
| 6,463,575 B1 | 10/2002 | Takahashi |
| 6,473,891 B1 | 10/2002 | Shively |
| 6,480,991 B1 | 11/2002 | Cho et al. |
| 6,490,713 B1 | 12/2002 | Matsumoto |
| 6,505,331 B1 | 1/2003 | Bracha et al. |
| 6,516,455 B1 | 2/2003 | Teig et al. |
| 6,519,751 B1 | 2/2003 | Huang et al. |
| 6,543,043 B1 | 4/2003 | Wang et al. |
| 6,546,540 B1 | 4/2003 | Igarashi et al. |
| 6,557,145 B1 | 4/2003 | Boyle et al. |
| 6,567,967 B1 | 5/2003 | Greidinger et al. |
| 6,601,227 B1 | 7/2003 | Trimberger |
| 6,618,849 B1 | 9/2003 | Teig et al. |
| 6,651,233 B1 | 11/2003 | Teig et al. |
| 6,671,864 B1 | 12/2003 | Teig et al. |
| 6,687,893 B1 | 2/2004 | Teig et al. |
| 6,738,960 B1 | 5/2004 | Teig et al. |
| 2001/0003843 A1 | 6/2001 | Scepanovic et al. |
| 2001/0009031 A1 | 7/2001 | Nitta et al. |
| 2002/0069397 A1 | 6/2002 | Teig et al. |
| 2002/0100007 A1 | 7/2002 | Teig et al. |
| 2002/0124231 A1 | 9/2002 | Teig et al. |
| 2002/0133798 A1 | 9/2002 | Teig et al. |
| 2002/0147985 A1 | 10/2002 | Teig et al. |
| 2002/0157075 A1 | 10/2002 | Teig et al. |
| 2002/0166105 A1 | 11/2002 | Teig et al. |
| 2002/0170027 A1 | 11/2002 | Teig et al. |
| 2002/0182844 A1 | 12/2002 | Igarashi et al. |
| 2002/0199165 A1 | 12/2002 | Teig et al. |
| 2003/0005399 A1 | 1/2003 | Igarashi et al. |
| 2003/0014725 A1 | 1/2003 | Sato et al. |
| 2003/0018947 A1 | 1/2003 | Teig et al. |
| 2003/0025205 A1 | 2/2003 | Shively |
| 2003/0043827 A1 | 3/2003 | Teig et al. |
| 2003/0056187 A1 | 3/2003 | Teig et al. |
| 2003/0063568 A1 | 4/2003 | Teig et al. |
| 2003/0063614 A1 | 4/2003 | Teig et al. |
| 2003/0064559 A1 | 4/2003 | Teig et al. |
| 2003/0066042 A1 | 4/2003 | Teig et al. |
| 2003/0066043 A1 | 4/2003 | Teig et al. |
| 2003/0066044 A1 | 4/2003 | Teig et al. |
| 2003/0079193 A1 | 4/2003 | Teig et al. |
| 2003/0088841 A1 | 5/2003 | Teig et al. |
| 2003/0088844 A1 | 5/2003 | Teig et al. |
| 2003/0088845 A1 | 5/2003 | Teig et al. |
| 2003/0101428 A1 | 5/2003 | Teig et al. |
| 2003/0115566 A1 | 6/2003 | Teig |
| 2003/0121017 A1 | 6/2003 | Andreev et al. |
| 2003/0192021 A1 | 10/2003 | Teig et al. |
| 2003/0217346 A1 | 11/2003 | Teig et al. |
| 2004/0044979 A1 | 3/2004 | Aji et al. |
| 2004/0098680 A1 | 5/2004 | Teig et al. |
| 2004/0098691 A1 | 5/2004 | Teig et al. |
| 2004/0098694 A1 | 5/2004 | Teig et al. |
| 2004/0098695 A1 | 5/2004 | Teig et al. |
| 2004/0098697 A1 | 5/2004 | Teig et al. |
| 2004/0098698 A1 | 5/2004 | Teig et al. |
| 2004/0103387 A1 | 5/2004 | Teig et al. |

FOREIGN PATENT DOCUMENTS

| | | |
|---|---|---|
| JP | 02-262354 | 10/1990 |
| JP | 03-173471 | 7/1991 |
| JP | 04-000677 | 1/1992 |
| JP | 05-102305 | 4/1993 |
| JP | 05-243379 | 9/1993 |
| JP | 07-086407 | 3/1995 |

| JP | 09-162279 | 6/1997 |
| JP | 11-296560 | 10/1999 |
| JP | 2000-82743 | 3/2000 |

OTHER PUBLICATIONS

Cho J.D., Wiring Space and Length Estimation in Two-Dimensional Arrays, May 2000, Computer-Aided Design of Integrated Circuits and Systems, IEEE Transactions on, vol. 19, Iss. 5, pp. 612-615.

Cong J. et al., DUNE—A Multilayer Gridless Routing System, May 2001, IEEE Transactions on Computer-Aided Design of Integrated Circuits and Systems, vol 20, iss. 5, pp. 633-647.

Dion J. et al., Contour: A Tile-based Gridless Router, Mar. 1995, Digital Western Research Laboratory, research Report 95-3, pp. 1-22.

Schulz U., Hierarchical Physical Design System, CompEuro '89, VLSI and Computer Peripherals, VSLI and Microelectronic Applications in Intelligent Peripherals and their Interconnection Networks, Proceedings, May 8-12, 1989, pp. 5/20-5/24.

Tseng H-P. et al., A Gridless Multilayer Router for Standard Cell Circuits Using CTM Cells, Oct. 1999, IEEE Transactions on Computer-Aided Design of Integrated Circuits and System, vol. 18, iss. 10, pp. 1462-1479.

U.S. Appl. No. 09/737,245, filed Dec. 13, 2000, Steven Teig et al.

U.S. Appl. No. 09/739,589, filed Dec. 15, 2000, Steven Teig et al.

Ahuja, A. et al., Faster Algorithms for the Shortest Path Problem, Journal of the Association for Computing Machinery, vol. 37, No. 2, Apr. 1990, pp. 213-223.

Alexander, M. et al., Performance-Oriented Placement and Routing for field-programmable gate arrays, Proceedings of the European Design Automation Conference, pp. 80-85, 1995.

Alexander, M. et al., Placement and Routing for Performance-Oriented FPGA Layout, VLSI Design, vol. 7, No. 1, 1998.

Berger, B. et al., Nearly Optimal Algorithms and Bounds for Multilayer Channel Routing, Journal of the Association for Computing Machinery, pp. 500-542, Mar. 1995.

Brady, L. et al., Channel Routing on a 60° Grid, extended abstract, pp. 926-931.

Brambilla, A. et al., Statistical Method for the Analysis of Interconnects Delay in Submicrometer Layouts, IEEE, Aug. 2001, pp. 957-966.

Carothers, K., A Method of Measuring Nets Routability for MCM's General Area Routing Problems, 1999, pp. 186-192.

Chen et al., Optimal Algorithms for Bubble Sort Based Non-Manhattan Channel Routing, May 1994, Computer-Aided Design of Integrated Circuits and Systems, IEEE Transactions Volume: 13 Issues, pp. 603-609.

Chen, H. et al., Physical Planning of On-Chip Interconnect Architectures, 2002, IEEE, International Conference, pp. 30-35.

Chen, H., Routing L-Shaped Channels in Nonslicing-Structure Placement, 24th ACM-IEEE Design Automation Conference, pp. 152-165, 1987.

Cheng, K. et al., Manhattan or Non Manhattan? A Study of Alternative VLSI Routing Architectures, pp. 47-52, 2000.

Cheng, K., Steiner Problem in Octilinear Routing Model, A Thesis submitted for the Degree of Master of Science, National University Singapore, 1995, pp. 1-122.

Chiang, C. et al., Wirability of Knock-Knee Layouts with 45° Wires, IEEE Transactions on Circuits and Systems, vol. 38, Issue 6, pp 613-624, Jun. 1991.

Chip Model with Wiring Cost Map, Aug. 1983, IBM Technical Disclosure Bulletin, vol. 26, issu. 3A, pp. 929-933.

Cho, J. et al., Four-Bend Top Down Global Routing, IEEE, pp 793-802, 1998.

Cong, J. et al., Efficient Heuristics for the Minimum Shortest Path Steiner Arborescence Problem with Applications to VLSI Physical Design, Cadence Design Systems, pp. 88-95.

Cong, J. et al., Multilevel Approach to Full Chip Gridless Routing, Nov. 2001, IEEE, pp. 396-403.

Cong, J. et al., Performance Driven Multi-Layer General Routing for PCB/MCM Designs, UCLA Computer Science Department, 1998, pp. 356-361.

Das, S. et al., Channel Routing in Manhattan-Diagonal Model, 9th International Conference on VLSI Design, Jan. 1996. pp. 43-48.

Das, S. et al., Routing of L-Shaped Channels, Switchboxes and Staircases in Manhattan-Diagonal Model, pp. 65-70, Jan. 1998.

Deguchi et al., Timing-driven hierarchical Global Routing with Wire-Sizing and Buffer-Insertion for VLSI Multi-Routing Layer, IEEE, Jan. 28, 2000, pp. 99-104.

Dood, P. et al, A Two-Dimensional Topological Compactor with Octagonal Geometry, 28th ACM/IEEE Design Automation Conference, pp 727-731, Jul. 1991.

Dutt, S. et al., Probability-Based Approach to VLSI Circuit Partitioning, IEEE Trans. on Computer-Aided Design of IC's and Systems, vol. 19, No. 5, May 2000, pp 534-549.

Enbody, R. et al., Near-Optimal n-Layer Channel Routing, 23rd Design Automation Conference, 1986, pp. 708-714.

Fang, S. et al., Constrained Via Minimization with Practical Considerations for Multi-Layer VLSI/PCB Routing Problem, 28th ACM/IEEE Design Automation Conference, 1991, pp. 60-65.

Farrahi, A. H. et al., Quality of EDA CAD Tools: Definitions, Metrics and Directions, Quality Electronic Design, 2000, Proceedings of the first International Sypmosium on Mar. 2000, pp 395-405.

Gonzalez et al., Multiterminal-net routing by grid stretching, Sep. 17-19, 1990, Computer Design: VLSI in Computers and Processors, 1990. ICCD '90. Proceedings, 1990 IEEE International Conference, pp. 396-399.

Hachtel, G.D. et al. et al., Linear Complexity Algorithms for Hierarchical Routing, Jan. 1989, IEEE pp 64-80.

Hom, I. et al., Estimation of the Number of Routing Layers and Total Wirelength in a PCB Through Wiring Distribution Analysis, 1996, pp. 1-6.

Hong, X. et al., Performance-Driven Steiner Tree Algorithms for Global Routing, 30th ACM/IEEE Design Automation Conference, 1993, pp. 177-181.

Hu, J.et al., A Timing-Constrained Algorithm for Simultaneous Global Routing of Multiple Nets, IEEE/ACM International Conference on Computer Aided Design. ICCAD—2000. IEEE/ACM Digest of Technical Papers (Cat. No. 00CH37140), Proceedings of International Conference on Computer Aided Design (ICCAD), San Jose, CA, USA, Nov. 5-9, 2000, pp. 99-103.

IBM Technical Bulletin, Wiring multimode nets, Dec. 1, 1983, IBM, vol. 26, issue 7B, pp. 3895-1900.

Igarashi, M. et al., A Diagonal-Interconnect Architecture and Its Application to RISC Core Design, 2002 IEEE Solid-State Circuits Conference, pp 210-460, Feb. 2002.

Kastner, R. et al, Predictable Routing, IEEE/ACM International Conference on Computer Aided Design. ICCAD—2000. IEEE/ACM Digest of Technical Papers (Cat. No. 00CH37140), Proceedings of International Conference on Computer Aided Design (ICCAD), San Jose, CA, USA, Nov. 5-9, 2000. pp. 110-113.

Khoo, K.et al., An Efficient Multilayer MCM Router Based on Four-Via Routing, 30th ACM/IEEE Design Automation Conference, 1993, pp. 590-595.

Leiserson, C. et al., Algorithms for Routing and Testing Routability of Planar VLSI Layouts, pp. 69-78, May 1985.

Lillis, J. et al., Table-Lookup Methods for Improved Performance-Driven Routing, 1998, pp. 368-373.

Lipski, W. et al., A Unified Approach to Layout Wirability, Mathimatical Systems Theory, 1987, pp. 189-203.

Lodi, E. et al., A 2d Channel Router for the Diagonal Model, pp. 111-125, Apr. 1991.

Lodi, E. et al., A Preliminary Study of a Diagonal Channel-Routing Model, Algorithmica, 1989, pp. 585-597.

Lodi, E. et al., Lecture Notes in Computer Science, A 4d Channel Router for a Two Layer Diagonal Model, pp. 464-476, Jul. 1988.

Lodi, E. et al., Routing in Times Square Mode, pp. 41-48, Jun. 1990.

Lodi, E. et al., Routing Multiterminal Nets in a Diagonal Model, pp. 899-902, 1988.

Naclerio, N. et al., Via Minimization for Gridless Layouts, 24th ACM/IEEE Design Automation Conference, 1987, pp. 159-165.

Nam, G. et al, Satisfiability-Based Layout Revisited: Detailed Routing of Complex FPGAs Via Search-Based Boolean SAT, 1999, pp. 167-175.

Nector, J., A New Look at Hardware Maze Routing, Proceedings of the 12th ACM Symposium on Great Lakes Sypmposium on VLSI, pp 142-147, Apr. 2002.

Oh, J. et al., Constructing Lower and Upper Bounded Delay Routing Trees Using Linear Programming, 33rd Design Automation Conference, 1996.

Overtone, G., EDA Underwriter 2 Finding Space in a Multi-layer Board, Electronic Engineering, Morgan-Grampian Ltd, vol. 67, No. 819, pp 29-30.

Parakh, P. et al., Congestion Driven Quadratic Placement, Proceedings of Design Automation Conference, 1998, pp 275-278.

Partitioning Logic on to Graph Structure, IBM Technical Disclosure Bulletin, Feb. 1990, vol. 32, iss. 9A, pp. 469-475.

Phillips, N., Channel Routing by Constraint Logic, Department of Computer Science Southern Illinois University, ACM, 1992.

Powers, K. et al., The 60° Grid: Routing Channels in Width d/square root 3, VLSI, 1991, Proceedings., First Great Lakes Symposium on Kalamazoo, MI, USA, pp 214-291, Mar. 1991.

Putatunda, R. et al., VITAL: Fully Automatic Placement Strategies for Very Large Semicustom Designs, Proceedings of the International Conference on Computer Design: VLSI in Computers and Processors, pp 434-439 Oct. 1988.

Schiele, W. et al., A Gridless Router for Industrial Design Rule, 27th ACM-IEEE Design Automation Conference, pp. 626-631, 1990.

Sekiyama, Y. et al., Timing-Oriented Routers for PCB Layout Design of High-Performance Computers, International Conference on Computer Aided Design, pp 332-335, Nov. 1991.

Staepelaere, D. et al., Surf: A Rubber-Band Routing System for Multichip Modules, pp 18-26, 1993.

Su, J. et al., Post-Route Optimization for Improved Yield Using Rubber-Band Wiring Model, 1997 International Conference on Computer-Aided Design, pp 700-706, Nov. 1997.

Takashima, Y. et al, Routability of FPGAs with Extremal Switch-Block Structures, IEICE Trans. Fundamentals, vol. E81-A, No. 5, May 1998, pp. 850-856.

Thakur, S. et al., Algorithms for a Switch Module Routing Problem, 1994, pp. 265-270.

Theune, D. et al., HERO: Hierarchical EMC-constrained routing, Nov. 1992, IEEE pp 468-472.

Tollis, I., Techniques for Wiring in Non-Square Grids, pp. 66-69, May 1989.

Tseng, H., Timing and Crosstalk Driven Area Routing, pp. 378-381.

Vannelli, A. et al., An adaptation of the interior point method for solving the global routing problem, Feb. 1991, IEEE pp193-203.

Vicente, J. RSR: A New Rectilinear Steiner Minimum Tree Approximation for FPGA Placement and Global Routing, Proceedings of the 24th Euro Micro Conference, pp 192-195, Aug. 1998.

Wang, D., Novel Routing Schemes for IC Layout, Part I: Two-Layer Channel Routing, 28th ACM/IEEE Automation Conference, 1991, pp. 49-53.

Wang, M. et al., Modeling and Minimization of Routing Congestion, Jan. 2000, IEEE proceedings of ASP-DAC, Asia and South Pacific, pp. 185-190.

Wei-Ming Dai, W. et al., Routability of a Rubber-Band Sketch, 28th ACM-IEEE Design Automation Conference, 1991. pp. 45-65.

Wood, G. et al., FPGA Routing and Routability Estimation Via Boolean Satisfiability, Department of Electrical and Computer Engineering Carnegie Mellon University, Pittsburgh, PA, pp. 119-125.

Yan et al., Three-Layer Bubble-Sorting -Based Non-Manhattan Channel Routing, ACM Transactions on Design Automation of Electronic Systems, vol. 5, No. 3, Jul. 2000, pp. 726-734.

Zhang, C.X. et al., Floorplan Design Using a Hierarchical Neutral Learning Algorithm, IEEE, Jun. 1991. pp. 2060-2063.

Zhou, H. et al., An Optimal Algorithm for River Routing with Crosstalk Constraints, 1996.

Zhou, H. et al., Optimal River Routing with Crosstalk Constraints, ACM Transactions on Design Automation of Electronic Systems, vol. 3, No. 3, Jul. 1998, pp. 496-514.

Zhou, H. et al., Global Routing with Crosstalk Constraints, Department of Computer Sciences, University of Texas, 1998, pp. 374-377.

* cited by examiner

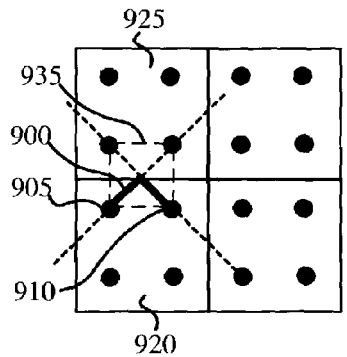
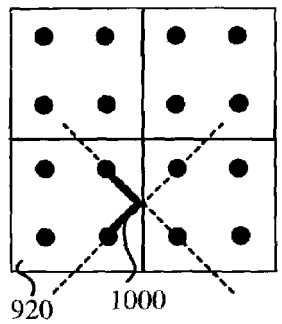
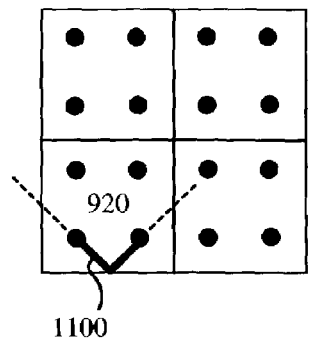
*Figure 9*  *Figure 10*  *Figure 11*
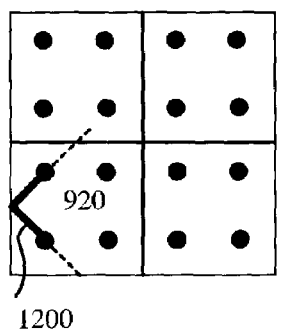
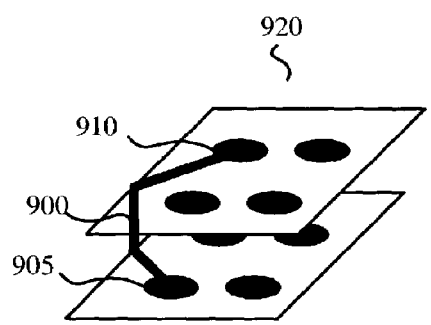
*Figure 12*  *Figure 13*
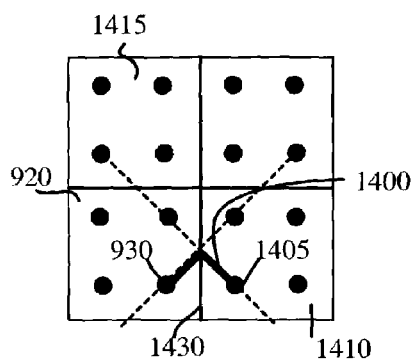
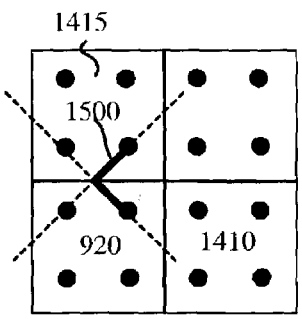
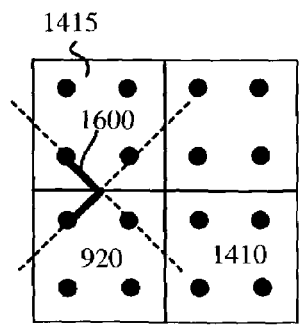
*Figure 14*  *Figure 15*  *Figure 16*

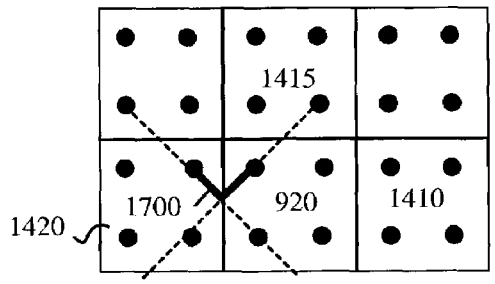 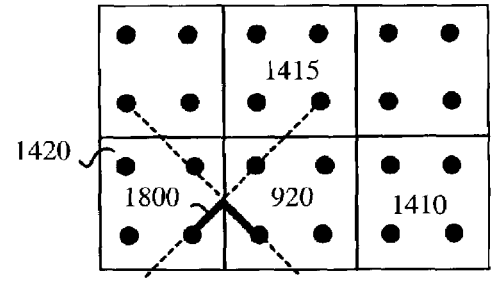
*Figure 17*      *Figure 18*
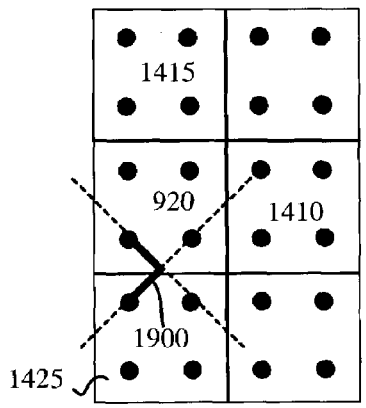 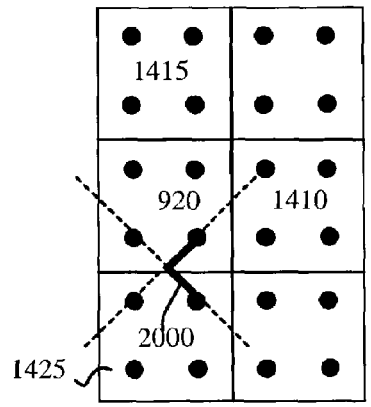
*Figure 19*      *Figure 20*
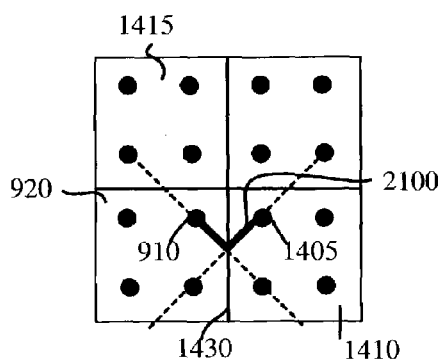 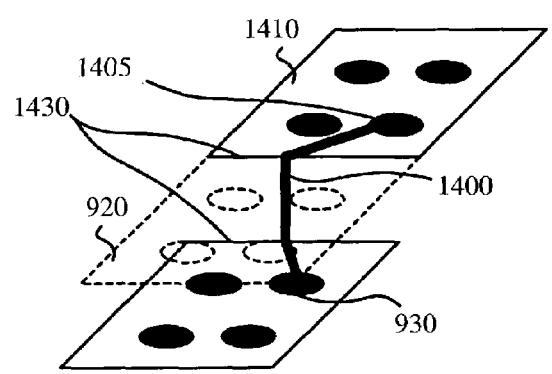
*Figure 21*      *Figure 22*

METHOD AND APPARATUS FOR ROUTING

CLAIM OF BENEFIT TO PRIOR APPLICATION

This patent application claims the benefit of U.S. Provisional Patent Application 60/427,131, filed Nov. 18, 2002.

FIELD OF THE INVENTION

The invention is directed towards a method and apparatus for routing.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Design engineers design IC's by transforming logical or circuit descriptions of the IC's into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. One EDA tool is a router that defines routes for interconnect lines that connect the pins of nets. Routing is generally divided into two phases: global routing and detailed routing. For each net, global routing generates a "loose" route for the interconnect lines that are to connect the pins of the net. The "looseness" of a global route depends on the particular global router used. After global routes have been created, the detailed routing creates specific individual routes for each net.

While some commercial global routers today might allow an occasional diagonal jog, these routers do not typically explore diagonal routing directions consistently when they are specifying the routing geometries of the interconnect lines. This, in turn, increases the total wirelength (i.e., total length of interconnect lines) needed to connect the nets in the layout. Therefore, there is a need for a routing method and apparatus that considers diagonal routing directions. There is also a need for a new way of identifying and costing routes.

SUMMARY OF THE INVENTION

Some embodiments of the invention provide a method of routing nets in a region of a layout with multiple layers. The method defines a routing graph that has several of nodes on plurality of layers, where each node represents a sub-region on a layer. In the graph, there is a set of edges between the nodes on each layer. On one layer, there is at least one set of edges that are neither orthogonal nor parallel to a set of edges on another layer. The method uses this routing graph to identify routes.

BRIEF DESCRIPTION OF THE DRAWINGS

The novel features of the invention are set forth in the appended claims. However, for purpose of explanation, several embodiments of the invention are set forth in the following figures.

FIGS. 9–12 illustrate four examples of internal zigs between the four nodes of a Gcell.

FIG. 13 presents a three-dimensional side view of the example illustrated in FIG. 9.

FIGS. 14–21 illustrate eight examples of external zigs between the four nodes of a particular Gcell and the eight nodes in four Gcells that are adjacent to the particular Gcell.

FIG. 22 presents a three-dimensional side view of the example illustrated in FIG. 14.

DETAILED DESCRIPTION OF THE INVENTION

Figure 1:
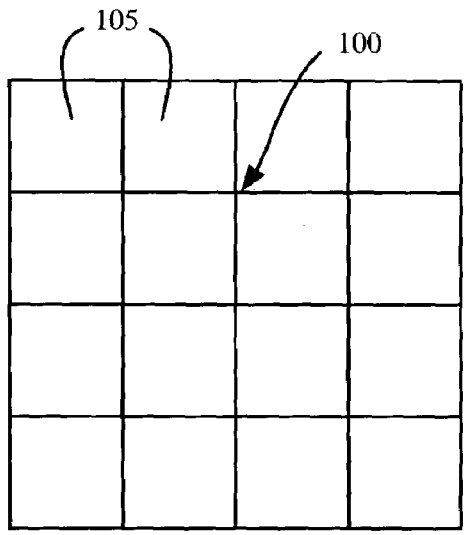
FIG. 1 illustrates a 4×4 section of a congestion grid.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Several embodiments of the invention provide a router that routes a set of nets in a region of an integrated circuit ("IC") layout. Each routed net includes a set of routable elements in the IC-layout region. The routable elements are pins in the embodiments described below, although they might be other elements in other embodiments.

In the embodiments described below, the router uses a five-layer wiring model that has horizontal wiring on wiring layer 1, vertical wiring on wiring layer 2, horizontal wiring on wiring layer 3, +45° diagonal wiring on wiring layer 4, and −45° diagonal wiring on wiring layer 5. One of ordinary skill will realize that the router can use other wiring models in other embodiments. In some embodiments, a line is "diagonal" if it forms an angle other than 0° or 90° with respect to the layout's Cartesian coordinate axes, which are typically parallel with the layout's boundary and/or the boundary of the layout's expected IC. On the other hand, an interconnect line is "horizontal" or "vertical" if it forms an angle of 0° or 90° with respect to one of the coordinate axes of the layout.

In the embodiments described below, the router partitions an IC-layout region into several square sub-regions. For each net being routed, the router then identifies a global route that connects the set of sub-regions that contain at least one pin of the net. Each net's global route is a set of edges (i.e., interconnect lines) that connects the set of sub-regions that contain the net's pins. The identified routes might have horizontal, vertical, and ±45° diagonal edges in the embodiments described below.

In these embodiments, the edges that are used to define each route are part of a routing graph used by the router. Section I provides an overview of this routing graph. Next, Section II provides the overall flow of the router. Section III then describes route-generation and path-generation processes used by the router. Section IV describes a computer system that can be used to implement some embodiments of the invention.

I. Routing Graph, Congestion Grid, and Length Grid

In some embodiments, the router uses two grids to create a routing graph. The first grid is a coarser grid that divides the IC layout into a number of sub-regions, called Gcells. The second grid is a finer grid that divides each Gcell into four sub-regions. In the embodiments described below, the Gcells are square. This shape well supports ±45° routing, as any set of +45° wiring tracks that cut through a square Gcell will fill its horizontal and vertical boundaries consistently. One of ordinary skill will realize that other embodiments might use different shaped Gcells.

On each wiring layer, each of the four sub-regions in each Gcell is represented by a node at the center of the sub-region. The embodiments described below use the coarser grid to measure route congestion in the layout region, and use the finer grid to measure route lengths. Accordingly, below, the coarser grid is referred to as the congestion grid, while the finer grid is referred to as the length grid.

Figure 2:
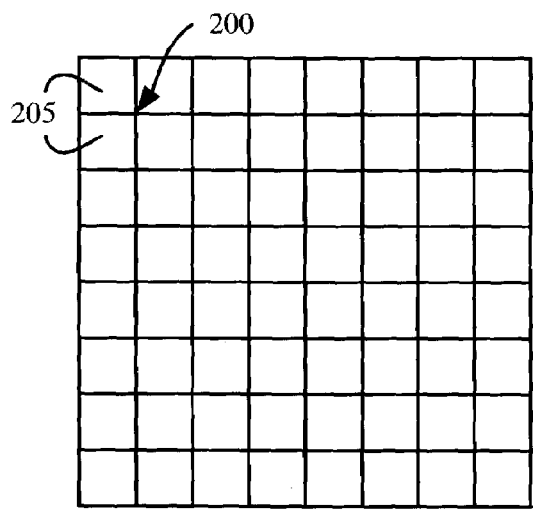
FIG. 2 illustrates a section of a length grid that divides each Gcell created by the congestion grid into four nodes.

FIGS. 1 and 2 illustrate small sections of the congestion and length grids. As shown in these figures, intersecting horizontal and vertical lines form both these grids. FIG. 1 illustrates a 4×4 section of the congestion grid 100. This section divides a portion of an IC region into 16 Gcells 105. In the embodiments described below, the congestion grid divides the IC region into many more Gcells (e.g., tens or hundreds of thousands).

Figure 3:
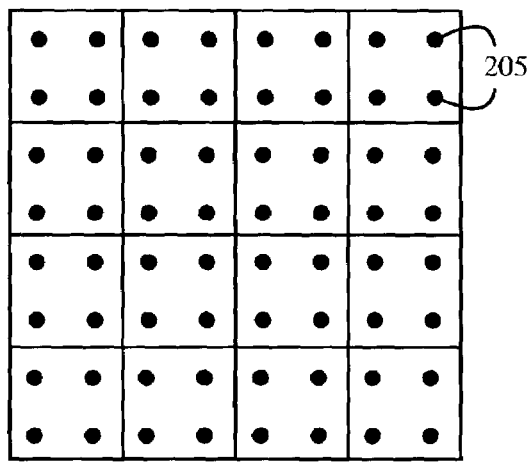
FIG. 3 illustrates the four nodes in each Gcell on a particular layer.

FIG. 2 illustrates a section of the length grid 200 that corresponds to the section of the congestion grid 100 illustrated in FIG. 1. As shown in this figure, the length grid divides each Gcell 105 into four nodes 205 on each wiring layer. FIG. 3 illustrates the four nodes in each Gcell on a particular layer. There are a number of planar and non-planar edges between the nodes defined by the length grid 200. These edges are referred to as "node edges" in the discussion below.

A. Planar Edges

A planar node edge connects two adjacent routing-graph nodes. Each such edge represents a set of wiring tracks along the edge's particular direction that connect the two subregions represented by the edge's two nodes. Planar node edges have different directions on different wiring layers. FIGS. 4 through 7 illustrate the directions of these edges on layers 2–5 in some embodiments. Some embodiments assume that there are no planar node edges between routing-graph nodes on layer 1, as this layer is often quite congested. Some of these embodiments promote all the pins on layer 1 to layer 2. Other embodiments, however, specify planar node edges on layer 1. In some of these embodiments, the planar node edges on layer 1 are in the same direction as node edges on layer 3.

Figure 4:
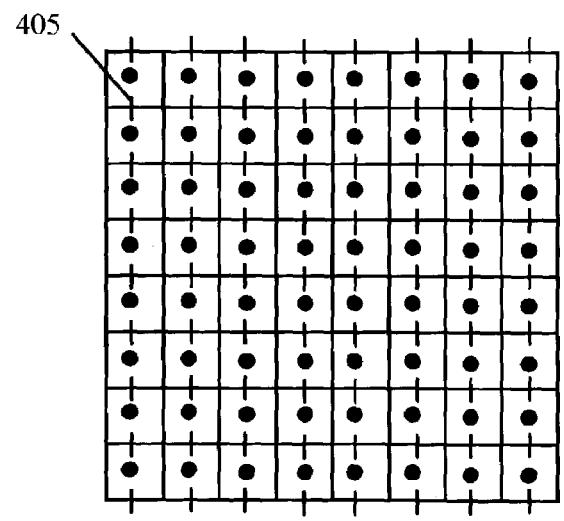
FIGS. 4–7 illustrate the directions of edges on interconnect layers 2–5 in some embodiments of the invention.
Figure 5:
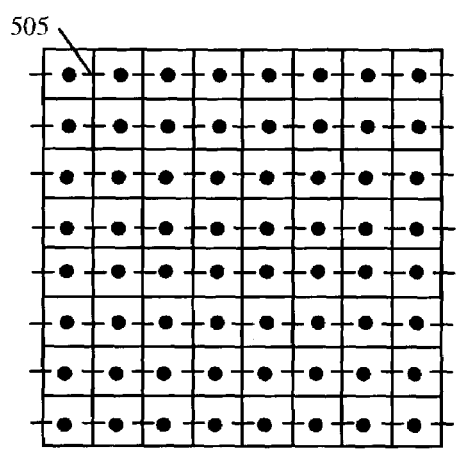
Figure 6:
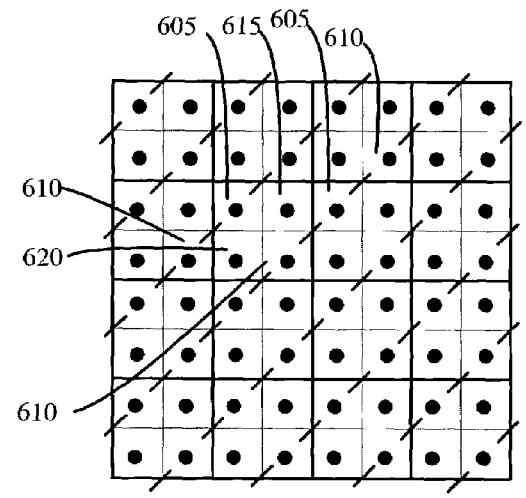
Figure 7:
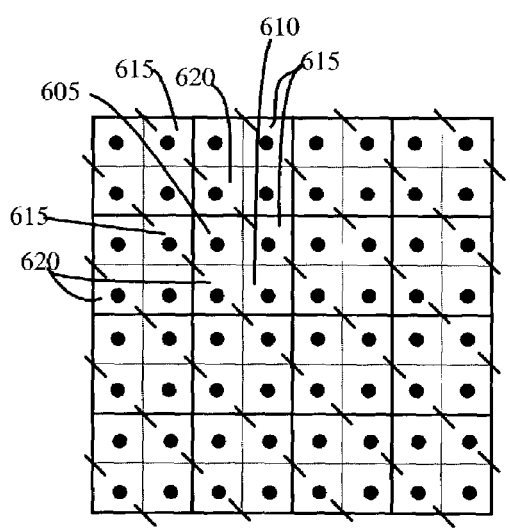

FIG. 4 illustrates that on layer 2 a vertical node edge 405 exists between each pair of vertically adjacent nodes, while FIG. 5 illustrates that on layer 3 a horizontal node edge 505 exists between each pair of horizontally adjacent nodes. FIGS. 6 and 7 illustrate that on layers 4 and 5, ±45° diagonal node edges exist only between certain pairs of diagonally adjacent nodes. Specifically, FIG. 6 illustrates that 45° diagonal node edges exist between northwest nodes 605 and southeast nodes 610 of different Gcells. As shown in this figure, no 45° diagonal node edges are incident on northeast nodes 615 and southwest nodes 620. FIG. 7 illustrates that −45° diagonal node edges exist between northeast node 615 and southwest nodes 620 of different Gcells. As shown in this figure, no −45° diagonal node edges are incident on northwest nodes 605 and southeast nodes 610.

In the embodiments described below, each Manhattan node edge on layer 2 or 3 has a unit length cost (L). In these embodiments, each diagonal node edge on layer 4 or 5 has a length cost that equals the unit length cost times the square root of two (L*√2). Also, the use of a node edge across a Gcell boundary reduces the capacity of the boundary, and is thereby assessed a wire congestion cost.

The router examines wire congestion at Gcell boundaries on each layer available for routing. Specifically, on each available-routing layer, the router computes capacities at Gcell boundaries for wiring along the particular layer's direction. On a particular layer, the wiring resources (i.e., wiring tracks) across a Gcell boundary can be conceptually represented as a planar "congestion edge" across that boundary on the particular layer in the layer's wiring direction.

Figure 8:
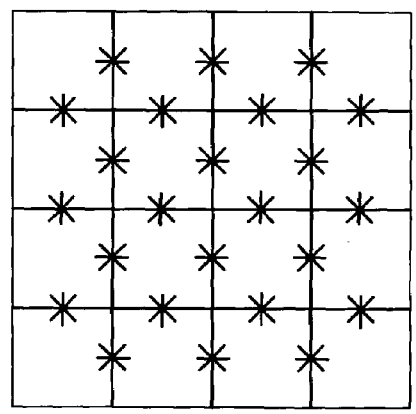
FIG. 8 illustrates edges that cross the Gcells created by the congestion grid.

FIG. 8 presents a two-dimensional diagram that illustrates the congestion edges on layers 2–5 for the routing directions illustrated in FIGS. 4–7. FIG. 8 illustrates one horizontal congestion edge across each vertical boundary between horizontally adjacent Gcells, one vertical congestion edge across each horizontal boundary between vertically adjacent Gcells, and two ±45° diagonal congestion edges across each boundary between each pair of adjacent Gcells. In this example, each vertical congestion edge is on layer 2, each horizontal congestion edge is on layer 3, each 45° congestion edge is on layer 4, and each −45° congestion edge is on layer 5.

The router keeps track of one congestion-grid capacity on each layer at each boundary between adjacent Gcells. Accordingly, each congestion edge is associated with all node edges that cross the same Gcell boundary on the same layer as the congestion edge. As illustrated in FIGS. 4–7, certain planar node edges cross the Gcell boundaries. In the embodiments described below, certain non-planar edges between layers 4 and 5 cross Gcell boundaries. These non-planar edges are further described in Section I.B.3.

In some embodiments that use the wiring model illustrated in FIGS. 4–7, the association between the congestion edges and the node edges is as follows. Each horizontal congestion edge on layer 3 is associated with the pair of horizontal node edges that cross the same Gcell boundary as the horizontal congestion edge on the layer 3. Each vertical congestion edge on layer 2 is associated with the pair of vertical node edges that cross the same Gcell boundary as the vertical congestion edge on layer 2.

Each 45° diagonal congestion edge on layer 4 (1) is associated with a 45° diagonal node edge that crosses the same Gcell boundary as the 45° diagonal congestion edge on layer 4, and (2) can be associated with two non-planar node edges between layers 4 and 5 that cross the same Gcell boundary as the 45° congestion edge. Each −45° diagonal congestion edge on layer 5 (1) is associated with a −45° diagonal node edge that crosses the same Gcell boundary as the −45° diagonal congestion edge on layer 5, and (2) can be associated with two non-planar node edges between layers 4 and 5 that cross the same Gcell boundary as the −45° congestion edge. The association between ±45° congestion edges and non-planar node edges will be described below in Section I.B.3.

Node edges start and terminate on nodes. Congestion edges, on the other hand, do not have explicit start and end points in some embodiments. This is because unlike node edges that are used to define routes, congestion edges function only to evaluate usage versus capacity. The router's use of node and congestion edges is further described below.

B. Non-Planar Edges: Vias.

In the embodiments described below, the router can define routes that use non-planar node edges. In these embodiments, non-planar node edges exist (1) between each pair of nodes that are overlapping and that are in two adjacent routing layers (e.g., are in layers 2 and 3 ), (2) between certain pairs of non-overlapping nodes that are within the same Gcell and that are on adjacent diagonal layers 4 and 5, and (3) between certain pairs of non-overlapping nodes that are within adjacent Gcells and that are on adjacent diagonal layers 4 and 5. Each non-planar node edge represents a via between the two layers traversed by the edge. A non-planar edge that is between non-overlapping nodes in layers 4 and 5 also represents wiring to and from the edge's via. Each of the non-planar edge types will now be described further.

1. Non-Planar Edge Between Overlapping Nodes.

The routing graph includes a non-planar node edge between each pair of overlapping nodes that are on two adjacent routing layers. Each such non-planar edge represents a via between the edge's two nodes. Each such edge is assessed a wirelength cost and a via congestion cost. The wirelength cost equals a via-scalar factor (X) times the unit length cost (L) (i.e., is assessed a wirelength cost X*L). The via-scalar factor is 1 in some embodiments, while it is greater or less than one in other embodiments. The use of any non-planar edge also incurs a via congestion cost that represents the potential difficulty in placing too many vias between the two layers traversed by the non-planar edge in the Gcell associated with the non-planar edge's via. For a non-planar edge between two overlapping nodes, the Gcell associated with the edge's vias is the Gcell containing the two nodes.

2. Non-Planar Edges Between Non-Overlapping Nodes in the Same Gcell: Internal Zigs Non-planar node edges exist between certain pairs of non-overlapping nodes that are within the same Gcell and that are on adjacent diagonal layers 4 and 5. Such non-overlapping nodes are called internal zigs. FIGS. 9 through 12 illustrate four internal zigs that some embodiments define between layers 4 and 5 in a Gcell. Each of these figures presents a two-dimensional top view of the routing graph. FIG. 13 presents a three-dimensional side view of the example illustrated in FIG. 9.

In FIGS. 9 and 13, an internal zig 900 goes from a northwest node 905 on layer 4 to a northeast node 910 on layer 5 in a Gcell 920. On layer 4, 45° node edges run through northwest nodes (such as node 905) but not through northeast nodes (such as node 910). Conversely, on layer, −45° node edges run through northeast nodes (such as node 910) but not through northwest nodes (such as node 905). Accordingly, the internal zig 900 allows a route running through node 905 or 910 to change layers and directions. As shown in FIGS. 9 and 13, this zig has three components. Two of its components are planar segments, where one segment is a 45° edge that runs northerly from the sub-region represented by node 905 on layer 4, while the other segment is a −45° edge that runs southerly to the sub-region represented by node 910 on layer 5. The third component is a non-planar component that is at the location where the two planar components overlap. The non-planar component represents a via, while the planar components represent wiring to and from the via. FIGS. 9 and 13 show the location of this intersection (i.e., the via location) to be on the Gcell boundary. However, in a detailed route representation of the internal zig 900, this intersection might occur anywhere within the sub-region 935 illustrated in FIG. 9.

The embodiments described below assess three costs for the internal zig 900. First, an internal zig is assessed a wirelength cost that equals a via-scalar factor (X) times the unit length cost (L) (i.e., is assessed a wirelength cost X*L). Second, an internal zig is assessed an additional wirelength cost, which is the unit length cost times the square root of two (i.e., it is L*√2). This additional wirelength cost represents the approximate wirelength necessary to traverse to and from the actual via location. Third, there is a via congestion cost associated with the internal zig. This via congestion cost represents the potential difficulty in placing too many vias between the two layers traversed by the internal zig in the Gcell associated with this zig's via. The Gcell associated with an internal zig's via is the Gcell containing the two nodes of the zig.

As mentioned above, the internal zig might not result in a via in Gcell 920 but might result in a via in Gcell 925 above it. Accordingly, unlike the embodiments described below, other embodiments might assess a via congestion cost for the Gcell 925 and/or assess a wire congestion cost to account for the congestion that the wiring associated with the internal zig might cause across the boundary between Gcells 920 and 925. As further described below for external zigs, via and wire congestion costs should be accounted for together, as the location of the via will determine the layer on which wires cross the congestion grid. Via congestion and wire congestion costs are further described below.

The internal zigs 1000, 1100, and 1200 that are illustrated in FIGS. 10, 11, and 12 are analogous to the internal zig 900, except that they connect different pairs of nodes in the Gcell 920. These three zigs are costed in the same manner as the zig 900.

3. Non-Planar Edges Between Non-Overlapping Nodes in the Adjacent Gcells: External Zigs Non-planar node edges exist between certain pairs of non-overlapping nodes that are within adjacent Gcells and that are on adjacent diagonal layers 4 and 5. Such non-overlapping nodes are called external zigs. FIGS. 14 through 21 illustrate eight external zigs that some embodiments define between one of four nodes of a particular Gcell (920) and one of eight nodes in the four Gcells (1410, 1415, 1420, and 1425) that are adjacent to the particular Gcell (920). Each of these figures presents a two-dimensional top view of the routing graph. FIG. 22 presents a three-dimensional side view of the example illustrated in FIG. 14.

FIGS. 14 and 22 illustrate an external zig 1400 between the node 930 on layer 4 of the Gcell 920 and the node 1405 on layer 5 of the Gcell 1410, which is adjacent to Gcell 920. On layer 4, 45° node edges run through southeast nodes (such as node 930) but not through southwest nodes (such as node 1405). Conversely, on layer 5, −45° node edges run through southwest nodes (such as node 1405) but not through southeast nodes (such as node 930). Accordingly, the external zig 1400 allows a route running through node 930 or 1405 to change layers and directions.

This zig traverses has three different components. Two of its components are planar segments, where one segment is a 45° edge that runs northerly from the sub-region represented by node 930 on layer 4, while the other segment is a −45° edge that runs southerly to the sub-region represented by node 1405 on layer 5. The third component is a non-planar component that is at the location where the two planar components overlap. The non-planar component represents a via, while the planar components represent wiring to and from the via.

There are four costs associated with the external zig 1400. First, an external zig is assessed a wirelength cost that equals a via-scalar factor (X) times the unit length cost (L) (i.e., is assessed a wirelength cost X*L). Second, the external zig is assessed an additional wirelength cost, which is the unit length cost times square root of two (i.e., it is L*√2). This extra wirelength cost represents the approximate wirelength necessary to traverse to and from the actual via location.

The third and fourth cost components are the via congestion cost and the wire congestion cost. As mentioned above, the use of any non-planar edge incurs a via congestion cost that represents the potential difficulty in placing too many vias between the two layers traversed by the non-planar edge in the Gcell associated with the non-planar edge's via. The wire congestion cost, on the other hand, represents the congestion that the wiring associated with the external zig causes across the Gcell boundary crossed by the external zig.

The via and wire congestion costs of an external zig depend on the actual location of the via represented by the external zig. However, an external zig specifies only that a via between layers 4 and 5 is placed close to the boundary between two Gcells (e.g., Gcells 920 and 1410), and does not specify an actual location of the via between layers 4 and 5. In other words, an external zig can be associated with a via location in either of the two Gcells that it traverses, and can be associated with either of the two diagonal congestion edges that are defined across the boundary between the two Gcells. Consequently, in some embodiments, the router associates the external zig with one of the Gcells and one of the diagonal congestion edges, in order to assign the via and wire congestion costs for using the external zig. To do this, the router first computes two sets of via and wire congestion costs, where (1) the first set is based on a via location in one Gcell and on a Gcell boundary-crossing along a particular congestion edge, and (2) the second set is based on a via location in the other Gcell and on a Gcell-boundary crossing along the other congestion edge. The router then identifies the set with the smaller aggregate via and wire congestion costs. It then specifies the external zig's via location and congestion edge as the identified set's via location and congestion edge.

Figure 23:
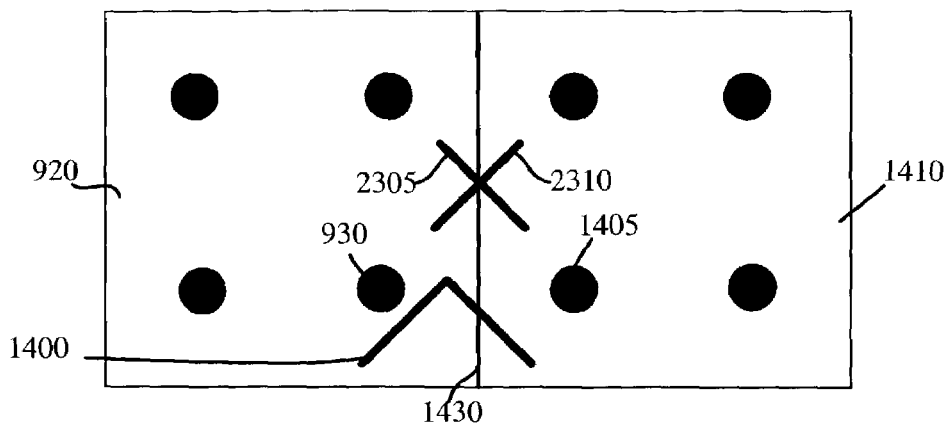
FIG. 23 illustrates a via location in a Gcell.

For instance, in FIGS. 14 and 22, the via for the external zig 1400 can be located in Gcell 920 or Gcell 1410. Accordingly, a first set of via and wire congestion costs V1 and W1 is computed based on an assumption that a detail route generated from the external zig 1400 would result in a via location in Gcell 920. FIG. 23 illustrates such a via location. For such a location, the via congestion cost V1 is computed. The cost V1 represents the increase in the via congestion between layers 4 and 5 in the Gcell 920. Section III will describe how via congestion costs are computed in some embodiments.

As shown in FIG. 23, the via location in Gcell 920 will require a −45° edge to cross the congestion-grid boundary 1430 between Gcells 920 and 1410 on layer 5. Hence, for this via location, the wire congestion cost W1 is computed. The cost W1 represents the increase in the congestion in the −45° direction on layer 5 across the Gcell boundary 1430. This wire congestion cost is computed by reference to the capacity and usage of congestion edge 2305, which represents the wiring tracks in the −45° direction across the Gcell boundary 1430. Section III will describe how wire congestion costs are computed in some embodiments.

Figure 24:
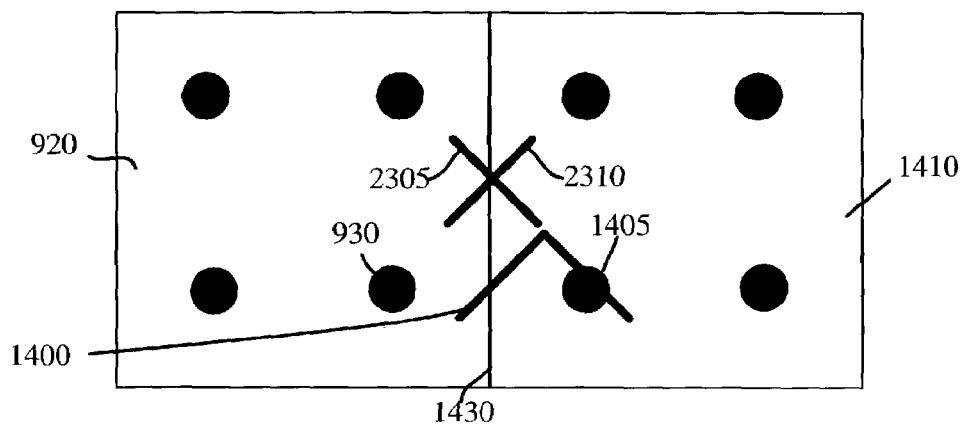
FIG. 24 illustrates a via location in another Gcell.

For the external zig 1400, FIG. 24 illustrates a via location in Gcell 1410. A second set of via and wire congestion costs V2 and W2 is computed for this via location. The via congestion cost V2 represents the increase in the via congestion between layers 4 and 5 in the Gcell 1410. Also, as shown in FIG. 24, this via location will require a 45° edge to cross the boundary 1430 on layer 4. Hence, for this via location, the wire congestion cost W2 represents the increase in congestion cost in the 45° direction on layer 4 across the Gcell boundary 1430. This wire congestion cost is computed by reference to the capacity and usage of congestion edge 2310, which represents the wiring resources in the 45° direction across the Gcell boundary 1430.

Once the two sets of costs are computed for the example in FIGS. 14 and 22, two aggregate values A1 and A2 are obtained by using a linear equation to sum the via and wire costs in each set. For instance, in some embodiments, A1 equals a*V1+b*W1, while A2 equals a*V2 +b*W2, where a and b are scalar values. The scalar values a and b are equal to 1 in some embodiments, while, in other embodiments, they differ from each other and/or are greater or less than 1.

After computing the aggregate values, the external zig is associated with the set that results in the smaller aggregate value. For instance, if the aggregate value A1 of the first set is smaller than the second set's aggregate value A2 in the example illustrated in FIGS. 23 and 24, the via location, edge crossing, and via and wire congestion costs of the first set are selected as the via location, edge crossing, and via and wire congestion costs of the external zig 1400. In other words, the router specifies the Gcell 920 as the Gcell that contains the via of the external zig 1400. It associates this external zig with the congestion edge 2305 (i.e., with a −45° edge crossing on layer 5). The router also specifies this external zig's incremental via and wire congestion costs as the values V1 and W1 (i.e., as the first-set incremental via and wire congestion costs).

The via and wire congestion costs in and across Gcells are values that continually evolve as the router embeds more routes. Hence, each time the router explores using a non-planar edge, the router uses the above-described approach to select the optimal via location and edge crossing for an external zig at that time.

The external zigs 1500–2100 that are illustrated in FIGS. 15–21 are analogous to the external zig 1400, except that they connect different node pairs. These seven external zigs 1500–2100 are costed in exactly the same manner as the zig 1400.

C. Route Representation With Respect to the Length and Congestion Edges

As described below, the router identifies the global route for a net by performing one or more path searches that identify one or more route segments that connect one or more pairs of pins/Steiner points of the net. Each path search tries to identify a path between two sets of nodes associated with the net along the node edges. If the path search identifies a path between the two sets, it embeds the identified path by reference to the node edges that the path traversed to go from one node set to the other. Hence, the router ends up defining each net's route in terms of the node edges.

However, in several instances, the discussion below refers to congestion edges used by a route or a path, where a path is an actual or potential portion of a route. A route or path is said to use a particular congestion edge if it is defined by reference to a planar or non-planar node edge that crosses the same boundary as the congestion edge on the same layer as the congestion edge. In other words, a route or path is said to use a particular congestion edge when it uses (1) a planar node edge associated with the particular congestion edge, or (2) a non-planar node edge that the router has associated with the particular congestion edge for the route's or path's use of the non-planar node edge.

Even though the embodiments described below define global routes by reference to the node edges, one of ordinary skill will realize that other embodiments might define a global route differently. For instance, some embodiments might define a global route in terms of the congestion edges.

II. Overall Flow of Router

Figure 25:
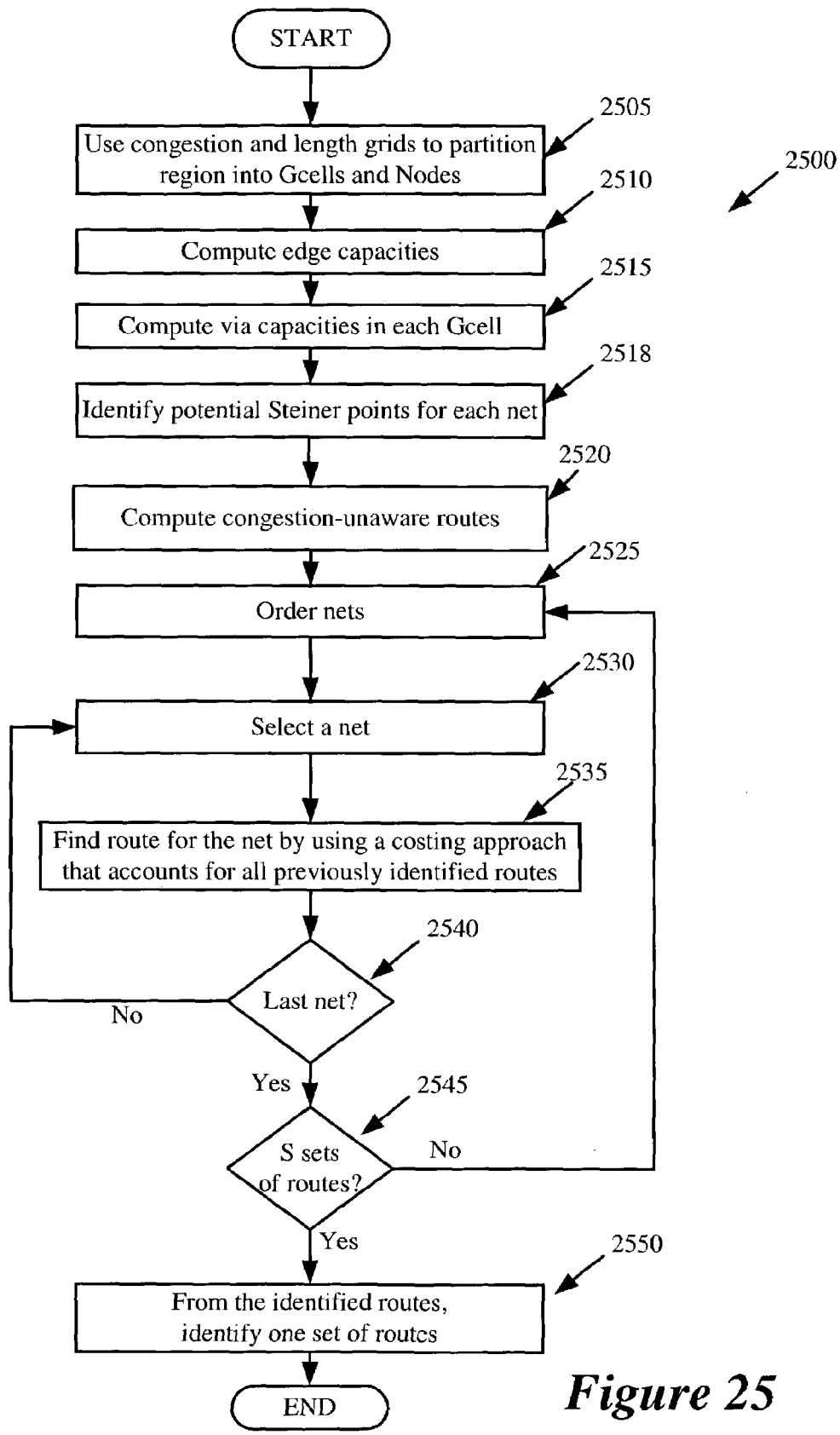
FIG. 25 illustrates a process that conceptually represents the overall flow of the router in some embodiments of the invention.

FIG. 25 illustrates a process 2500 that conceptually represents the overall flow of the router in some embodiments of the invention. As shown in this figure, the process 2500 initially uses (at 2505) the congestion and length grids 100 and 200 to partition the IC layout region into numerous Gcells, with four nodes on each routing layer in each Gcell. As described above, these Gcells and nodes define a routing graph in which the router defines and embeds routes.

Next, the process computes (at 2510) the capacities of congestion edges between adjacent Gcells. These edges were described above by reference to FIG. 8. The capacity of a congestion edge is typically determined by a variety of factors, such as the size of the sub-regions, the pitch (width and spacing) of the wiring tracks represented by the edge, and the obstructions near edge.

Figure 26A:
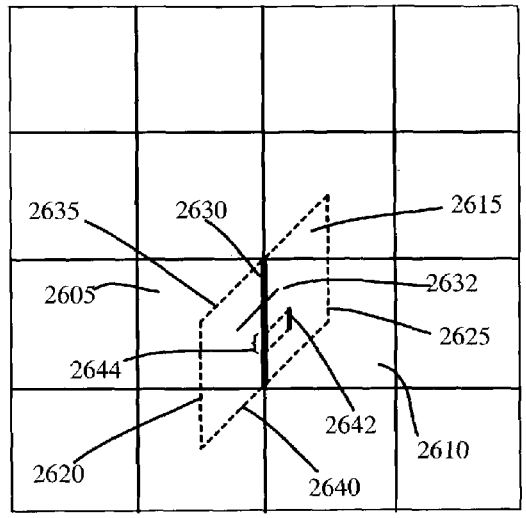
FIGS. 26A, 26B, and 26C present three examples that illustrate how some embodiments compute the capacity of a congestion edge between two Gcells on a given layer.
Figure 26B:
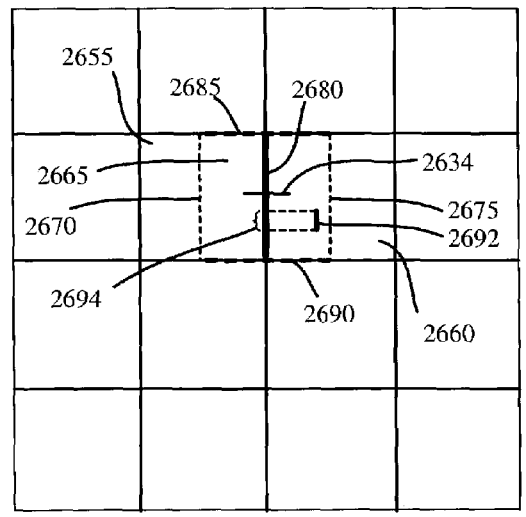

FIGS. 26A and 26B present two examples that illustrate how the process 2500 computes the capacity of a congestion edge in some embodiments. In the description of these examples, "pitch" refers to the sum of the default wire width and spacing for a given layer, projected in the wiring direction for that layer onto a Gcell boundary that it crosses. For a ±45-degree wire, this projection increases width and spacing by a factor of $\sqrt{2}$ compared to their ordinary values.

To compute the capacity of a congestion edge that crosses a Gcell boundary on a given layer, the process 2500 (1) defines a parallelogram about the Gcell boundary, (2) identifies potential obstacles in the parallelogram, (3) identifies the intersection of the projection in the layer's wiring direction of the identified obstacle with the boundary, (4) specifies any identified intersection as a blocked portion of the boundary, and (5) derives the congestion-edge capacity from the unblocked portion of the boundary.

In some embodiments, the process identifies a parallelogram about a Gcell boundary in the following manner. It identifies a first pair of parallel sides of the parallelogram by translating the Gcell boundary onto the midpoint of each of the two Gcells in the direction of the layer's wiring direction. These two sides will be parallel to the boundary between the Gcells and will traverse through the Gcell midpoints. The second pair of the parallelogram's parallel sides are in the layer's wiring direction and connect to the parallelogram's first pair of sides (i.e., each side in the second pair terminates at one end of each side of the first pair).

FIG. 26A illustrates a parallelogram 2615 that is defined for a congestion edge 2632 that crosses a Gcell boundary 2630 on layer 4, while FIG. 26B illustrates a parallelogram 2665 that is defined for a congestion edge 2634 that crosses a Gcell boundary 2680 on layer 3. The boundary 2630 is between Gcells 2605 and 2610, while the boundary 2680 is between Gcells 2655 and 2660. The diagonal congestion edge 2632 is associated with one 45° node edge that crosses the boundary 2630 on layer 4, while the horizontal congestion edge is associated with two horizontal node edges that cross the boundary 2680 on layer 3.

In FIG. 26A, the wiring direction on layer 4 is the 45° diagonal direction. Accordingly, the boundary 2630 is translated onto the center of the Gcells 2605 and 2610 in the 45° diagonal direction. This translation defines two parallel vertical sides 2620 and 2625 of the parallelogram 2615. These two sides are parallel to the boundary 2630 and respectively run through the center of Gcells 2605 and 2610. The other two sides of the parallelogram are sides 2635 and 2640, which are in the layer's wiring direction (which is the 45° direction) and connect to sides 2620 and 2625.

In FIG. 26B, the wiring direction is horizontal. Accordingly, the boundary 2680 is translated onto the center of the Gcells 2655 and 2660 in the horizontal direction. This translation defined two parallel vertical sides 2670 and 2675 of the parallelogram 2665. These two sides are parallel to the boundary 2680 and respectively run through the center of Gcells 2655 and 2660. The other two sides of the parallelogram 2665 are sides 2685 and 2690, which are in the layer's wiring direction (which is the horizontal direction) and connect to the sides 2670 and 2675.

After identifying the parallelogram about a congestion-edge's Gcell boundary, the process then identifies each potential obstacle (e.g., each piece of pin, obstruction, or pre-route metal) that falls in the parallelogram. For each potential obstacle identified in the parallelogram, the process then identifies the portion of the boundary that the obstacle would intersect if the obstacle were moved across the boundary in the layer's wiring direction. For instance, FIG. 26A illustrates a pin 2642 on layer 4 that falls within the parallelogram 2615. As shown in this figure, this pin would intersect portion 2644 of the boundary if it were moved across the boundary 2630 in the 45° direction. FIG. 26B illustrates a pin 2692 on layer 3 that falls within the parallelogram 2665. As shown in this figure, the pin 2692 would intersect portion 2694 of the boundary 2680 if it were moved across this boundary in the horizontal direction.

The process treats all identified intersected portions of the boundary as blocked segments of the boundary. The process then estimates the capacity of a congestion edge to be the total length ($T^u$) of all unblocked intervals on the congestion edge's boundary that are at least one pitch long, divided by pitch (P), i.e., the capacity of the congestion edge equals $$\frac{T_U}{P}.$$

Figure 26C:
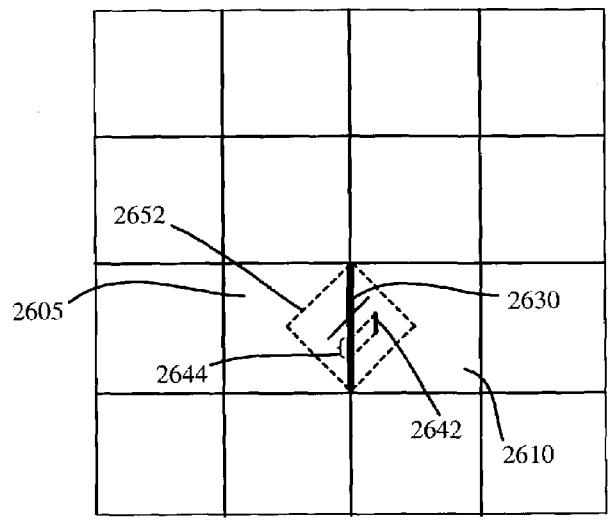

Some embodiments might not treat each piece of pin, obstruction, or pre-route metal as a blockage on the interval of boundary onto which it translates in the routing direction. Also, some embodiments might differently define the region to examine near a boundary crossed by a congestion edge. For instance, some embodiments might define different parallelograms on the diagonal layers. Instead of the parallelogram 2615 in FIG. 26A, some embodiments might define a parallelogram 2652 illustrated in FIG. 26C. This parallelogram 2652 has the Gcell centers and the Gcell boundary endpoints as its four vertices.

After 2510, the process computes (at 2515) the via capacity between each two adjacent layers in each Gcell. In a given Gcell, the via capacity between two adjacent layers is computed as a user-adjustable constant times the maximum of all capacities of planar congestion edges into the Gcell on either of the layers. The constant is typically less than 2. In some embodiments, it is 1.7.

After 2515, the process then identifies (at 2518) a set of potential Steiner points for each net that it is routing. Steiner points for a net can be found by (1) representing each pin of the net as a unique (x,y) position given by the centroid of its pin geometry, (2) assigning an edge cost between any two points in the plane equal to the octilinear distance between them, and (3) invoking a procedure given in "A fast and simple Steiner routing heuristic", by Manjit Borah, Robert Owens, and Mary Jane Irwin, Discrete Applied Mathematics 90 (1999), pp. 51–67. One manner of computing the octilinear distance between two points is described in U.S. patent application Ser. No. 10/174,662, entitled "Method and Apparatus for Estimating Distances in a Region," and filed on Jun. 19, 2002. The U.S. patent application Ser. No. 10/174,662 is incorporated herein by reference. One skilled in the art will recognize that a variety of other heuristics may be used to generate Steiner points. Also, the Steiner set for a net might be an empty set in certain situations.

Next, for each net that it is being routed, the process identifies (at 2520) a congestion-unaware route that does not account for via congestion within the Gcells or wire congestion at Gcell boundaries. The generation of a congestion-unaware route for a net will be further described below in Section III.

After 2520, the process performs two nested loops. The inner loop identifies one set of routes for each net being routed, while the outer loop causes the inner loop to run several (e.g., 8) times to generate several (e.g., 8) sets of routes. The generated sets of routes typically differ. These sets often differ because, in the embodiments described below, the inner loop uses a route-generation process that employs a costing function that accounts for resources used by the routes previously identified by the inner loop. The outer loop runs from 2525 to 2545, while the inner loop runs from 2530 to 2540.

At 2525, the process sorts the nets. In some embodiments, the first time the process reaches 2525 it sorts the nets in an ascending order of the lengths of their congestion-unaware routes, which were identified at 2520. The process then selects (at 2530) a net according to the order specified at 2525. It then identifies (at 2535) a route for the selected net. To identify this route, the process typically uses a route generation process that employs a costing function that accounts for resources used by the routes previously identified at 2535. No previously identified route exists for the first net in the first pass of the process 2500 through 2535. However, one or more such routes exist in every subsequent pass through 2535. The route identification at 2535 will be further described below in Section III. As mentioned above, the process 2500 typically uses a route generation process at 2535 to identify a route for a net. However, in some cases, the process might not identify a new route at 2535 for a net, but rather might identify a previous route (e.g., the most recent route) that it previously identified for the net.

After identifying a route for the selected net, the process determines (at 2540) whether it has generated a route for all the nets in the current pass through 2525–2545 (i.e., whether the selected net is the last net in the order specified in the last pass through 2525). If not, the process selects (at 2530) the next net in the order specified in the last pass through 2525, identifies (at 2535) a route for this net, and then determines (at 2540) whether this net is the last net in the order specified in the last pass through 2525.

Once the process determines (at 2540) that it has generated a route for all the nets in its current pass through 2525–2545, the process determines (at 2545) whether it has generated the desired number (S) of route sets. If not, the process returns to 2525 to initiate another pass through the outer loop (i.e., through 2525 to 2545) so that it can generate another set of routes. For this pass through, the process can specify (at 2525) the same net order as, or a different net order than, the previous pass through the outer loop. Some embodiments specify a different net order for each pass through the outer loop in an attempt to increase the differences between the sets of generated routes.

When the process determines (at 2545) that it has generated the desired number of route sets, the process then identifies (at 2550) one set of routes from all the generated routes. Different embodiments use different techniques to select (at 2550) one combination of routes from the set of identified routes. One suitable technique is randomized rounding, which is described in Randomized Algorithm, by Rajeev Motwani and Prabhakar Raghavan, Cambridge University Press (1995, 1997).

Several other suitable techniques are described in United States Patent Application entitled "Method and Apparatus for Solving an Optimization Problem," filed concurrently with the present application, and filed with Express Mail Number EV169571637US. This application is incorporated herein by reference. One technique described in this incorporated application identifies one set of routes by first specifying a set that has one identified route for each net. It then iteratively examines all the nets. During the examination of each particular net, the process iteratively examines all the identified routes for the particular net. During the examination of each particular route for each particular net, the process replaces the current route for the particular net in the solution set with the particular route if the replacement would improve the solution set. Under this approach, the set that remains after all the identified routes of all the nets have been examined is the set identified at 2550.

After 2550, the process ends.

III. Route Generation

Figure 27:
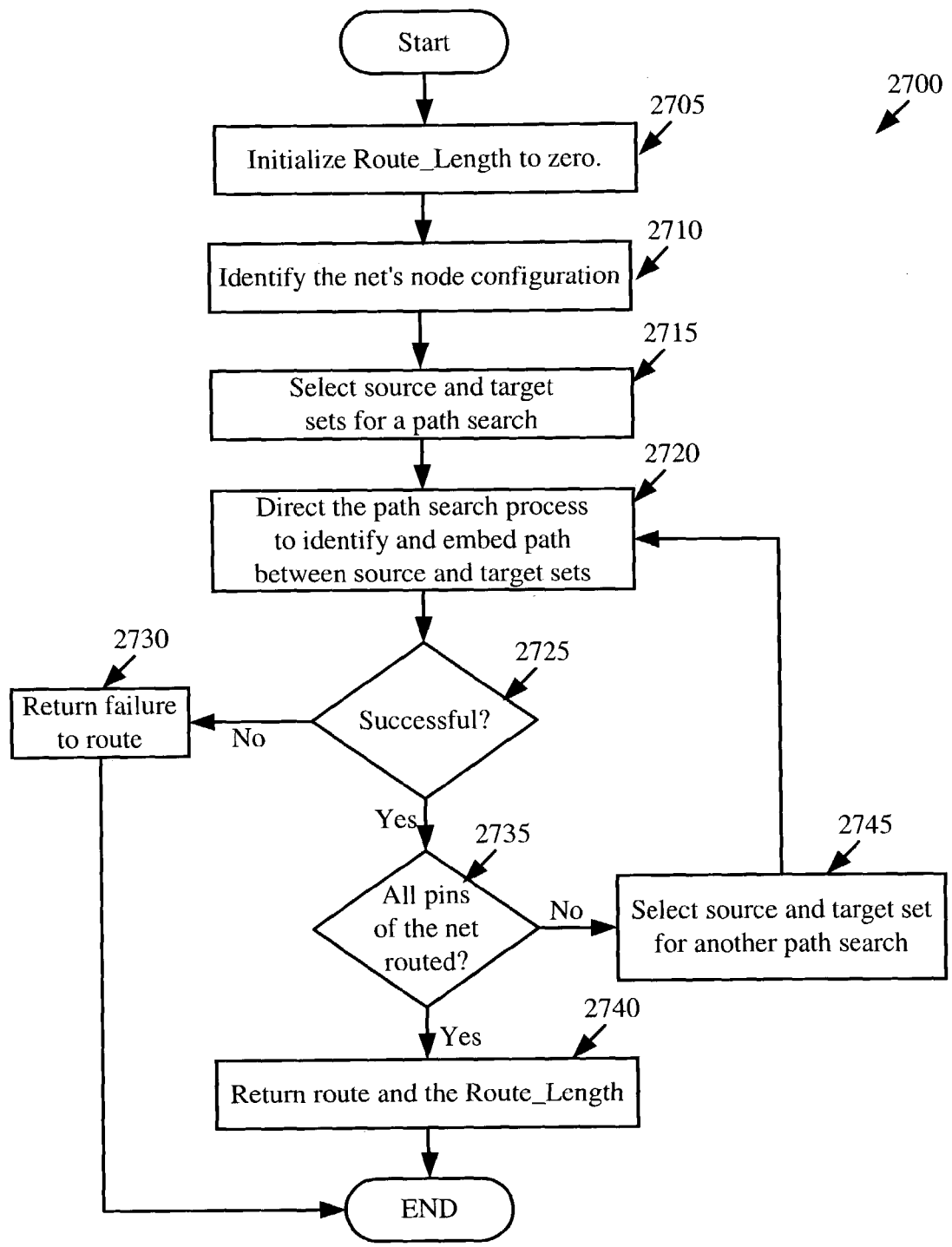
FIG. 27 illustrates a route-generation process that the routing process uses to generate a route for a particular net in some embodiments of the invention.

FIG. 27 illustrates a route-generation process 2700 that the routing process 2500 can use (at 2535) to generate a route for a particular net in some embodiments. The process 2700 starts (at 2705) by initializing a variable, Route_Length, to zero. The process uses this variable to specify the length of the route that it tries to construct for the net.

The process then identifies (at 2710) the nodes (i.e., the length-grid sub-regions on each layer) that contain the particular net's set of pins and Steiner points. These nodes will be referred to as the configuration nodes of the particular net. After identifying the configuration nodes once for a net, some embodiments store the configuration nodes for the net, so that they can be retrieved the next time that they are needed. In some cases, a pin or a Steiner point can be in more than one length-grid sub-region (i.e., more than one node). Hence, each pin or Steiner point is associated with a set of nodes. Also, in some embodiments, each Steiner point is specified only by an x- and y-coordinate. Hence, it can be on any layer in the routing graph. Accordingly, in some embodiments, the node on each layer that includes the x- and y-coordinates of a net's Steiner point is added to the net's configuration nodes.

After identifying the configuration nodes for the particular net, the process specifies (at 2715) source and target node sets for a first path search. In some embodiments, the process specifies the target set as a node set that is associated with a particular pin of the net. It then specifies the nodes of all other pins and Steiner points in the net's configuration that are within a certain distance of the target set as source nodes. In some embodiments, this distance is a certain percentage greater than the distance between the target set and the node in the net's configuration closest to the target set.

On layers 4 and 5, the net pins might be in nodes that do not have planar edges running through them. However, such nodes are target and source nodes that need to be expanded to and from during a path search. It would be inefficient to reach these nodes only through non-planar edges. Accordingly, to address this situation, some embodiments specify one or more nodes that are adjacent to such nodes on the same layer as "shadow nodes." A shadow node of a particular node in effect augments the representation of the particular node's pin in a path search. A particular node's shadow is a source node when the particular node is a source node, and is a target node when the particular node is a target node. In other words, a path can expand from a particular node's shadow node when the particular node serves as a source node. When the particular node is a target of a path search, an expansion to the particular node's shadow node is treated as an expansion to the target node.

Figure 28:
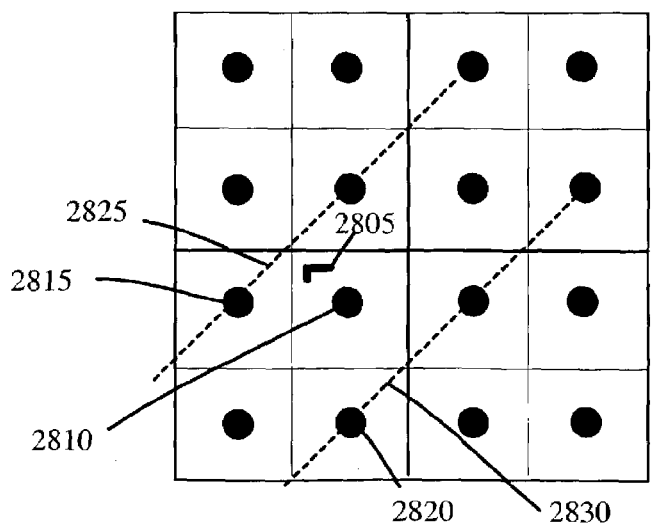
FIG. 28 presents one example of shadow nodes.

FIG. 28 presents one example of shadow nodes. This figure illustrates a pin 2805 in a node 2810 on layer 4. Layer 4 has 45° node edges that connect the northwest and southeast nodes on this layer. Node 2810, however, is a northeast node that does not have a planar node edge running through it. This node could be a target or source node. However, it would be difficult to reach this node since it has no incident planar node edge. Consequently, to address this situation, some embodiments specify node 2815 and/or node 2820 as shadow nodes of node 2805. As shadow nodes, node 2815 and 2820 can be treated as source nodes of a path search when node 2810 is a source node, and they can be treated as target nodes of a path search when node 2810 is a target node.

Some embodiments would specify both node 2815 and node 2820 as shadow nodes of node 2810. Other embodiments would specify only one of these two nodes as a shadow node. For instance, some of these embodiments would specify node 2815 as the shadow node since pin 2805 is closer to the node edge 2825 running through node 2815 than the node edge 2830 running through node 2820. Other embodiments might take this approach (i.e., might expand only from the shadow node that is closest to the actual pin) only when one or more node edges connected to the shadow node is not blocked (e.g., by an obstacle). When a node edge connecting to the shadow node that is closest to the actual pin is blocked, some of these embodiments might select the other adjacent node as an additional shadow node.

After specifying (at 2715) the source and target sets for a path search, the process directs (at 2720) a path-generation process to identify and embed the lowest-cost path between the specified source and target sets. If the path-search process embeds the lowest-cost path, the path-generation process increments the Route_Length by the length of the embedded path. The path-generation process is further described below by reference to FIG. 29.

At 2725, the route-generation process determines whether the path-generation process was able to identify and embed a path between the specified source and target sets. If not, the process 2700 has failed to find a route for the net. Accordingly, it returns (at 2730) a notification specifying its failure and then ends.

The router's response to this notification was not illustrated in FIG. 25, in order not to obscure the description of the router's flow with unnecessary details. However, it should be noted that the router responds differently to this notification in different embodiments. For instance, in some embodiments, the router can remove from the routing problem a net that the process 2700 fails to route. In other embodiments, the router removes the net only if it repeatedly fails to find a route for the net after re-adjusting the net order and trying to find a complete routing solution.

If the process determines (at 2725) that the path-generation process identified and embedded a path, it determines (at 2735) whether it has routed all the pins of the net. If so, the process 2700 notifies (at 2740) the process 2700 that it has embedded a route for the net and provides this route and its associated Route_Length.

If the process 2700 determines (at 2735) that it has not routed all the pins of the net, the process specifies (at 2745) new source and target sets for another path search. In some embodiments, the process specifies (at 2745) as the target node set (1) all the nodes that are associated with the routed pins and Steiner points, and (2) all nodes that are currently on the one or more paths that the path-generation process has embedded for the net during the current route generation. In some embodiments, the process specifies (at 2745) as the source node set all nodes associated with any unrouted pin and Steiner point in the net's configuration that are within a certain distance of the target set. In some embodiments, this distance is a certain percentage greater than the distance between the target set and a node in the net's configuration that is closest to the target set and that is associated with a pin or Steiner that has not yet been routed. After specifying the source and target sets at 2745, the process 2700 returns to 2720 to direct the path-generation process to identify and embed the lowest-cost path between the specified source and target sets. The operation of the process 2700 from 2720 was described above.

A. Path Generation.

Figure 29A:
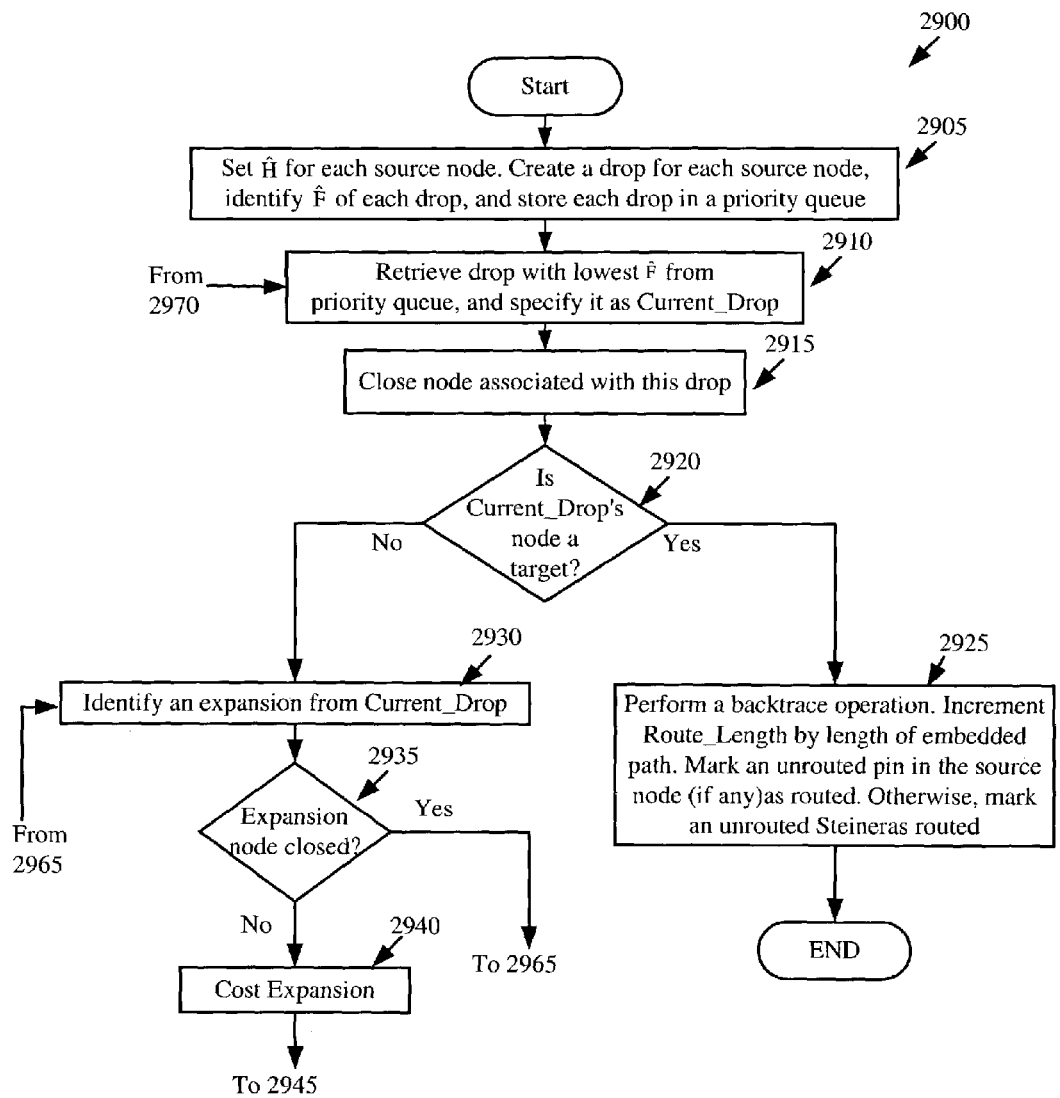
FIG. 29 illustrates a path-generation process that the route-generation process uses in some embodiments.
Figure 29B:
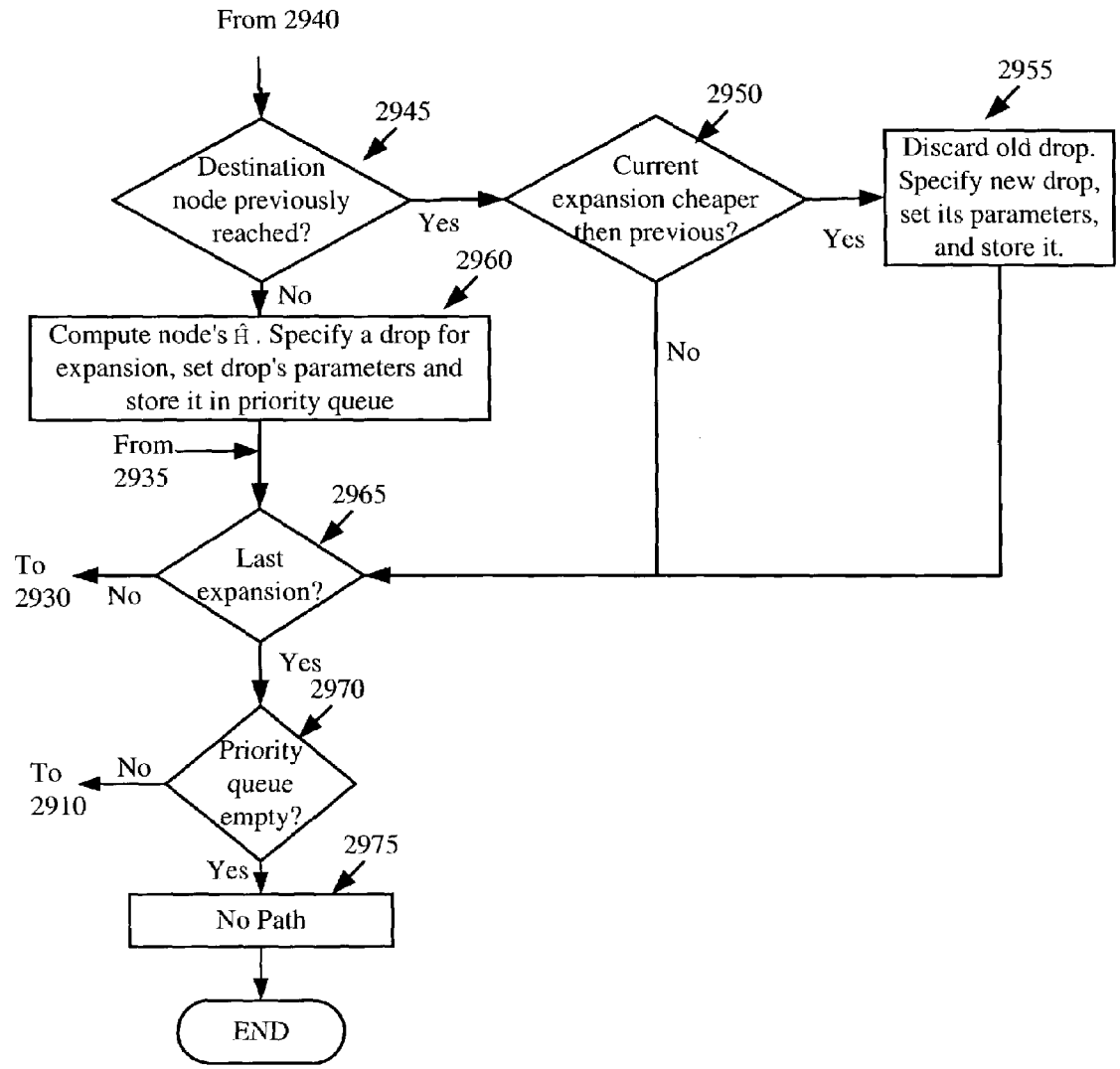

At 2720, the route-generation process 2700 calls a path-generation process to identify and embed a path between source and target node sets in the routing graph. In some embodiments, the router uses an A* path-generation process 2900 that is illustrated in FIG. 29. This process has two phases: (1) a path exploration phase, during which the process identifies a path between the specified source and target node sets, and (2) a path-embedding phase, during which the process embeds the identified path.

The process 2900 is an iterative best-first search that at each iteration tries to extend a partial solution with the best estimated cost. Specifically, during its path exploration phase, the process 2900 starts its path search by specifying the start of one or more paths from one or more source nodes. It then iteratively identifies one or more path expansions about the lowest cost path, until it identifies a path that connects a source node and a target node. Each identified expansion about a path is from a "current node" (also called "start node") reached by the path being extended to a "destination node" that neighbors the current node.

For each expansion, the process computes an $\hat{F}$ cost, which is the estimated cost of the path from a source node through the expansion's destination node to a target node. This cost can be expressed as:

$$\hat{F} = G + \hat{H}. \quad (1)$$

In this equation, G represents the cost of the path that has reached the expansion's destination node, while $\hat{H}$ represents an estimated cost of a path from the expansion's destination node to the set of target nodes. In the embodiments described below, the $\hat{H}$ cost expresses the lower-bound estimate of the shortest path from the expansion's destination node to the target set. Accordingly, in these embodiments, the $\hat{F}$ cost expresses the estimated cost of a lowest-cost path from a source node through the expansion's destination node to a target node. Also, in these embodiments, the G and hence the $\hat{F}$ account for several different types of costs, such as a wirelength, wire congestion, and via congestion. Each of these costs is further described below.

As shown in FIG. 29, the process 2900 initially (at 2905) identifies and sets the $\hat{H}$ of each source node that the process 2700 specified for the current path search. Each node's $\hat{H}$ expresses the estimated distance between the node and the target set in the current path search. During each search, the process 2900 stores the $\hat{H}$ cost for each node after computing this cost, so that it only has to compute it once for each node reached in each search. Different embodiments compute a node's $\hat{H}$ differently. Some embodiments use a rectilinear bounding box technique that is used in conventional A* path searches. Other embodiments, however, use the novel techniques described in the above-incorporated U.S. patent application Ser. No. 10/174,662. One technique described in this application identifies two bounding boxes that each enclose the target set. One bounding box has sides that are parallel to one of the layout's coordinate axes. The other bounding has sides that are rotated by 45° with respect to the layout's coordinate axes. This technique then identifies the distance between the node and each of the two bounding boxes. It then identifies the node's $\hat{H}$ as the longer of the two identified distances.

For each source node, the process 2900 also specifies (at 2905) a "drop," which is path identifier that represents a path expansion. Specifically, a drop represents an expansion from a start node to a destination node by referring to the destination node as its node and referring back to the drop of the start node. Drops allow the process 2900 to keep track of the paths that it explores. For each drop, the process also stores (1) a G cost, which is the cost of a path from a source node to the drop's node through the sequence of expansions that led to the drop, and (2) an $\hat{F}$ cost, which is the drop's G cost plus the $\hat{H}$ cost of the drop's node (i.e., the $\hat{H}$ cost of the destination node of the expansion for which the drop was specified). One of ordinary skill will realize that other embodiments might not use drops or might implement drops differently.

At 2905, a drop that is defined for a source node refers to the source node as its node and defines the drop's prior drop as null. The process sets the G cost of each drop defined at 2905 to zero, and sets the drop's $\hat{F}$ cost equal to $\hat{H}$ cost of the drop's node. At 2905, the process stores the specified drops in a storage structure, which, in some embodiments, is a priority queue (e.g., a heap) that is ordered based on the $\hat{F}$ costs of the drops.

Next, at 2910, the process retrieves from the priority queue a drop with the smallest F cost, and specifies this drop as the Current_Drop. The process then "closes" (at 2915) the drop's node. A closed node is a node to which the process can no longer expand during the path search. Consequently, the closing of node at 2915 prevents the process 2900 from expanding to this node during the current path search.

The process then determines (at 2920) whether the Current_Drop's node is a node in the target set for the current path search. If not, the process performs a series of operations in a loop from 2930 to 2965, in order to explore all possible expansions about the Current_Drop. Specifically, at 2930, the process identify one of the possible expansions about the Current_Drop. Table 1 below lists all the possible expansions from the Current_Drop's node for a wiring model that allows routing only on layers 2–5.

TABLE 1

| Drop's Layer | Planar Expansion | Non-Planar Expansions |
|---|---|---|
| 2nd Layer | If drop's node is not on the north or south boundary of the layout, two planar expansions are possible to the two nodes that are adjacent to the drop's node in the ±90° directions. If the drop's node is on the south or north layout boundary, then one planar expansion is available to the one node adjacent to the drop's node in the +90° or −90° direction. | Expansion to the node directly above the drop's node. |
| 3rd Layer | If drop's node is not on the east or west boundary of the layout, two planar expansions are possible to the two nodes that are adjacent to the drop's node in the 0° and 180° directions. If the drop's node is on the east or west boundary of the layout, then one planar expansion is available to the one node adjacent to the drop's node in the +180° or 0° direction. | Expansion to nodes directly above and below the drop's node. |
| 4th Layer | If drop's node is not on periphery of the layout and it is either the northwest or southeast node of a Gcell, two planar expansions are possible to the two nodes that are adjacent to the drop's node in the +45° and −135° directions. If the drop's node is on the periphery of the layout and it is either the northwest or southeast node of a Gcell, then zero planar expansion is possible or one planar expansion is available to the one node adjacent to the drop's node in the +45° | Expansion to nodes directly above and below the drop's node. Also, two internal zig expansions, where each expansion is to a node that is in layer 5 in the same Gcell as the drop's node. Up to two external zig expansions, where each such expansion is to a node that is in layer 5 in another Gcell which is adjacent to the Gcell containing the drop's node. |

TABLE 1-continued

| Drop's Layer | Planar Expansion | Non-Planar Expansions |
|---|---|---|
| | or −135° direction. There are no planar expansions from a drop's node if this node is the northeast or southwest node of a Gcell. | |
| 5th Layer | If drop's node is not on periphery of the layout and it is either the southwest or northeast node of a Gcell, two planar expansions are possible to the two nodes that are adjacent to the drop's node in the −45° and +135° directions. If the drop's node is on the periphery of the layout and it is either the southwest or northeast node of a Gcell, then zero planar expansion is possible or one planar expansion is available to the one node adjacent to the drop's node in the −45° or +135° direction. There are no planar expansions from a drop node if this node is the southeast or northwest node of a Gcell. | Expansion to nodes directly above and below the drop's node. Also, two internal zig expansions, where each expansion is to a node that is in layer 4 in the same Gcell as the drop's node. Up to two external zig expansions, where each such expansion is to a node that is in layer 4 in another Gcell which is adjacent to the Gcell containing the drop's node. |

In some embodiments that use a wiring model that allows routing on layer 1, the expansion possibilities on layer 1 are similar to the expansion possibilities on layer 3, except that there are no non-planar expansions to a layer below. Also, in these embodiments, the process can expand from a node on layer 2 to a node directly below on layer 1.

After selecting an expansion at 2930, the process determines (at 2935) whether the destination node of the expansion is a closed node. If so, the process transitions to 2965, which is further described below. Otherwise, the process computes (at 2940) a G cost for the expansion. The computation of this cost is described further below.

After 2940, the process determines (at 2945) whether the destination node of the expansion specified at 2930 has been previously reached in the current path search. If not, the process (at 2960) computes and stores the destination node's Ĥ cost. The computation of this cost was described above at 2905. At 2960, the process also specifies a drop for the expansion specified at 2930. The process associates the specified drop with the expansion's destination node, and sets the drop's previous drop to the Current_Drop. The process also (1) sets this specified drop's G cost to the G cost computed at 2940 for the expansion, and (2) sets the specified drop's F̂ cost to the sum of the drop's G cost and the Ĥ cost of the drop's node (i.e., the expansion's destination node). The process then stores (at 2960) the drop specified at 2960 in the priority queue based on its F̂ cost. From 2960, the process transitions to 2965, which will be described below.

If the process determines (at 2945) that the specified expansion's destination node has been previously reached in the current path search, the process determines (at 2950) whether the identified expansion's G cost (computed at 2940) is less than the G cost of the drop in the priority queue that is associated with the expansion's destination node. If not, the expansion specified at 2930 is not the cheapest expansion to its destination node. Hence, in this situation, the process stops its examination of the expansion identified at 2930, and transitions to 2965, which is further described below.

On the other hand, if the process determines (at 2950) that the identified expansion's G cost (computed at 2940) is less than the G cost of the drop in the priority queue that is associated with the expansion's destination node, the process removes the drop associated with the destination node from the priority queue, and specifies a new drop for this node. The process associates the new drop with the identified expansion's destination node, and sets the drop's previous drop to the Current_Drop. The process also (1) sets this newly specified drop's G cost equal to the identified expansion's G cost (computed at 2940) for the expansion, and (2) sets the specified drop's F̂ cost to the sum of the drop's G cost and the Ĥ cost of the drop's node (i.e., the Ĥ cost of the expansion's destination node). The process then stores (at 2955) the newly specified drop in the priority queue based on its F̂ cost. From 2955, the process transitions to 2965.

At 2965, the process determines whether there is any expansion about the Current_Drop's node that it has not yet examined. If so, the process transitions back to 2930 to identify another expansion, and then performs the subsequent operations to determine whether to specify a drop for this newly identified expansion.

When the process determines (at 2965) that it has examined all expansions about the Current_Drop's node, the process determines (at 2970) whether the priority queue that stores the drops is empty. If so, the process has failed to find a path between the specified source and target sets. Accordingly, it returns (at 2975) a notification specifying its failure and then ends. On the other hand, when the process determines (at 2970) that the priority queue is not empty, the process transitions back to 2910 to retrieve the drop with the smallest F̂ cost from the priority queue and then to perform the above-described operations for this drop.

The process has found a path between the source and target sets when it determines (at 2920) that the Current_Drop's node is a target. In this situation, the process transitions from 2920 to 2925. At 2925, the process also embeds the identified path between the source and target sets. Starting at the Current_Drop on the target, the embedding "back traces" the sequence of drops that reached the target and generates an ordered list of (1) nodes associated with the drops and (2) node edges between these nodes.

Figure 30:
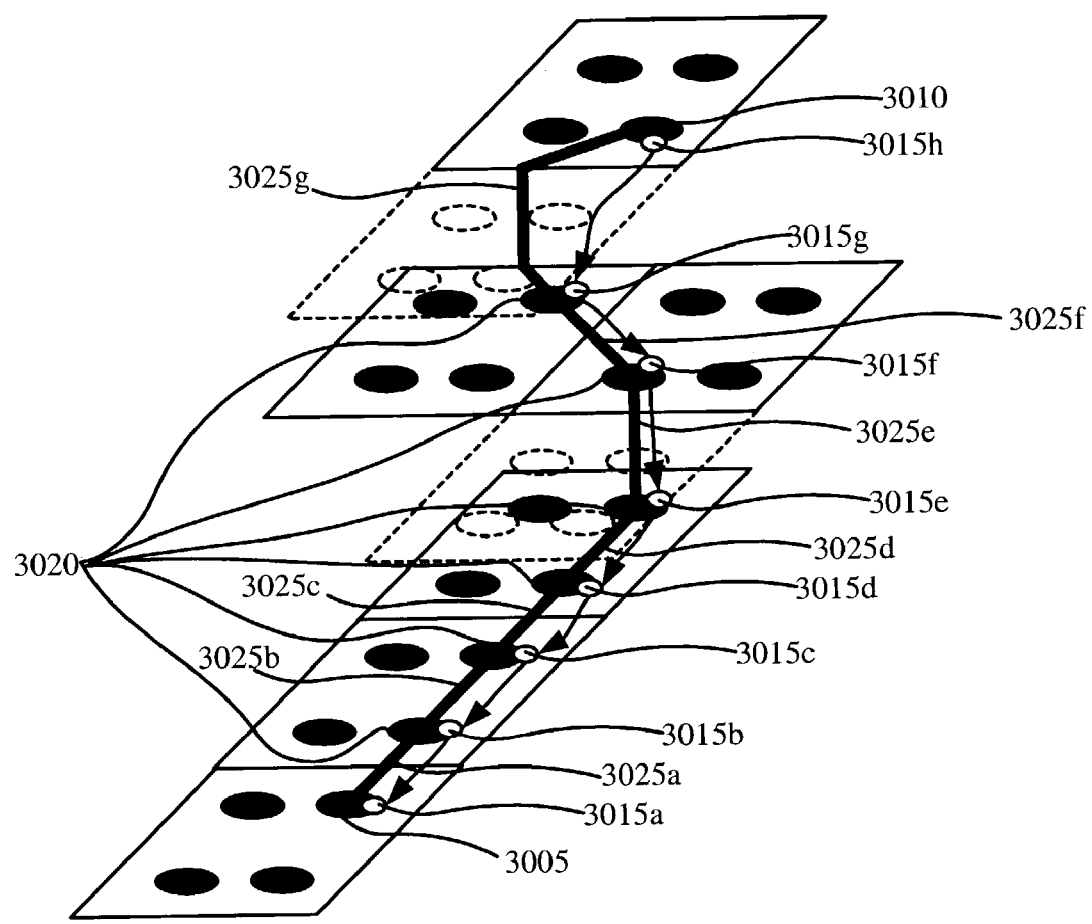
FIG. 30 illustrates an example of a back trace operation used by the path-generation process of FIG. 29.

FIG. 30 illustrates an example of a back trace operation. In this example, the path search has identified a path between a source node 3005 and a target node 3010. This path has traversed through layers 3–5. To identify this path, the path search has identified a series of drops 3015a–3015h. With the exception of the first source-node drop 3015a that has a null back reference, each drop has a reference to a previous drop in the path. The back trace would start at the drop on the target and follow each drop's back reference to identify all of the path's drops, the nodes associated with these drops, and the edges between the nodes of successive drops. In this manner, the back trace would identify an ordered list of nodes 3020 between the source and target nodes 3005 and 3010, and an ordered list of edges 3025a–3025g between these nodes.

Some embodiments then define the global route path by reference to the ordered list of node edges produced through the back trace. In the example illustrated in FIG. 30, this ordered list would include edges 3025a–3025g. Other embodiments would identify the global route path by reference to the ordered list(s) of nodes and node edges identified in the back trace. In the example illustrated in FIG. 30, this ordered list(s) would include edges 3025a–3025g and node 3005, nodes in the set 30020, and node 3010.

At 2925, the process 2900 increments the Route_Length by the length of the identified global route path. This length is simply the sum of the length of the node edges identified through the back trace, where the length of a planar horizontal or vertical node edge is L, the length of a diagonal node edge is L*√2, the length of a non-planar nodes edge between overlapping nodes is X*L, and the length of a non-planar edge between non-overlapping nodes is (X+√2)*L.

At 2925, the process also determines if the source node that it reached through its back trace at 2925, includes one or more pins that are marked as unrouted. If the process identifies one or more such pins at 2925, it then selects one of these pins and marks it as routed. When there are no such pins in the source node reached through the back trace, the source node contains at least one Steiner point that is marked unrouted. Hence, when the source node does not contain an unrouted pin, the process selects (at 2925) a previously unrouted Steiner point and marks it as routed.

In some cases, the source and target node sets partially or completely overlap. In such cases, the path search transitions to 2925 the first time it reaches 2920, and hence it will not identify any expansions. At 2925, the back trace then simply identifies a previously unrouted pin or Steiner in a node that is in both the source and target node sets as a routed pin or Steiner. In other words, this back trace results in an empty set of global-route node edges as a pin or Steiner is reached without requiring any node edges. In this situation, some embodiments define a special "node-internal" edge between a previously unrouted "point" and a newly routed "point" in the source/target node, where a point in this case can be a pin or a Steiner point. Some of these embodiments use such an edge purely for internal bookkeeping, while others augment the notion of the global route to include this node-internal edge. When all of a net's pins are in the same node, the router only identifies node-internal edges. In such a situation, the resulting global route can be specified as either null (e.g., an empty set of node edges), or as a collection of node-internal edges.

One of ordinary skill will realize that the path-generation process might be implemented differently in other embodiments. For instance, in some embodiments, the Ĥ cost might not specify a lower bound on the shortest path between a drop's node and a target set. In addition, some embodiments might compute the F̂ cost slightly differently. For instance, some embodiments might express the F̂ cost as:

$$\hat{F}=G+2*\hat{H}.$$

Such a cost would bias the search process to expand about the drops that are closer to the target set. Alternative embodiments might express the F̂ cost as:

$$\hat{F}=G+\hat{H}+\hat{J},$$

where Ĵ represents the estimated computational effort needed to complete the path from the current drop. The embodiments that use alternative F̂ cost might not satisfy the admissibility requirement. Also, instead of an A* search, other embodiments might perform other types of path searches.

B. Costing an Expansion

As described above, the path-generation process 2900 computes the G cost of an expansion at 2940. The embodiments described below use a cost function with several exponential components that depend on wirelength, wire-congestion, and via-congestion costs. In costing an expansion, the congestion components account for all the routes that the router has identified at 2535 before the current path search on the edges being considered. In this manner, these components bias the path search to spread the routes to favor evenly distributed congestion profiles over those with sharp peaks. Even though exponential cost terms are described below, one of ordinary skill will realize that other embodiments might use other types of costing functions to evaluate the routes.

1. General Exponential Costing Expression

For some embodiments, Equation (A) below provides a cost function that represents the G cost of an expansion to a destination node d.

$$G = \left(Y_L * e^{\varepsilon_L * \frac{\hat{F}_L(d)}{\hat{H}_{\text{MIN}}}}\right) + \left(\sum_{j=1}^{m} Y_j * \left(e^{\varepsilon_C * \frac{new\ usage(j)}{goal(layer(j))*capacity(j)}} - e^{\varepsilon_C * \frac{old\ usage(j)}{goal(layer(j))*capacity(j)}}\right)\right) + \left(\sum_{t=1}^{K} Y_t \left(e^{\varepsilon_V * \frac{new\ usage(t)}{goal(layer\ pairs(t))*capacity(t)}} - e^{\varepsilon_V * \frac{old\ usage(t)}{goal(layer\ pairs(t))*capacity(t)}}\right)\right) \quad (A)$$

In this equation, the first exponential component represents a wirelength cost, the second exponential component represents a wire congestion cost, and the third exponential component represents a via congestion cost. Table 2 provides a definition for the variables in these components.

TABLE 2

| Term | Definition |
| --- | --- |
| e | The base of the natural logarithm. |
| $\varepsilon_L$, $\varepsilon_C$, $\varepsilon_V$ | User-adjustable exponential-multiplier parameters. |
| $Y_L$, $Y_j$, and $Y_t$ | Normalizing variables. |
| $\hat{F}_L(d)$ | The estimated length of the path from a source node through the expansion's destination node d to a target node. This estimated length equals the length of the path that has reached the expansion's destination node d, plus the destination node's Ĥ. |
| $\hat{H}_{\text{MIN}}$ | The minimum Ĥ of the set of sources of the current path search. |
| j | One of m congestion edges that are used by the path that has reached the expansion's destination node d. If the path has not used any congestion edge, then m equals 0 and the wire congestion component of Equation (A) is zero. |
| old usage(j) | The cumulative number of times that all the routes previously identified at 2535 use the congestion edge j. In some embodiments, the router computes |

TABLE 2-continued

| Term | Definition |
|---|---|
| | and updates the old usage(j) value after each iteration of 2535 of the process 2500. |
| new usage(j) | The cumulative number of times that the congestion edge j is used by (1) all the routes previously identified at 2535, and (2) the path that has reached the expansion's destination node d. New usage(j) equals old usage(j) plus 1. |
| capacity(j) | The estimated number of available tracks of the congestion edge j. In some embodiments, this capacity is a value from 0 to 16. This number was computed at 2510 of the process 2500. |
| goal(layer(j)) | A target upper bound on the congestion ratio on the layer that contains edge j. |
| t | One of K non-planar edges that are on the path that has reached the expansion's destination node d. If the path has not used any non-planar edge, then t equals 0 and the via congestion component of Equation (A) is zero. |
| old usage(t) | In all the routes previously identified at 2535, the number of non-planar edges that via in the same Gcell as edge t between the same two layers as edge t. With the exception of external zigs, the Gcell that contains the via represented by edge t is the Gcell that contains the two nodes connected by edge t. If edge t is an external zig, the Gcell of the via associated with the external zig edge t is the Gcell that results in the smaller aggregate via and wire congestion costs for this instance of use of the external zig t, as described in Section I.B.3. After each iteration of 2535 of the process 2500, the router in some embodiments computes and updates the via usage values for each pair of adjacent routing layers in each Gcell. |
| new usage(t) | In all the routes previously identified at 2535, and in the path that has reached the expansion's destination node d, the number of non-planar edges that via in the same Gcell as edge t between the same two layers as edge t. See discussion in the definition of old usage(t) regarding the Gcell that contains edge t's via. New usage(t) equals old usage(t) plus 1. |
| capacity(t) | The estimated number of vias that can traverse the same two layers as edge t in this edge's Gcell. In some embodiments, this capacity is a value from 0 to 27. This capacity was computed at 2515 of the process 2500. |
| goal(layer pairs(t)) | A target upper bound on the via congestion ratio between the two adjacent layers traversed by the non-planar edge t. |

Each of the three components in Equation (A) includes an exponential expression. The exponential expressions are normalized to the same scale by multiplying them by the normalizing factors $Y_L$, $Y_j$, and $Y_t$. In some embodiments, the multiplier $Y_L$ is expressed by the following equation:

$$Y_L = Y_{LI} * e^{\varepsilon_L * \frac{\sum_{N=1}^{R} Length(N)}{T.E.L}},$$

where (1) $Y_{LI}$ is a constant, (2) N is one of the R routes identified thus far at 2535, (3) length (N) is the length of the route N, and (4) T.E.L stands for total estimated length and equals the sum of the estimated length of each net's route. In some embodiments, the total estimated length is the sum of the lengths of the congestion-unaware routes (identified at 2520) of all nets; in other embodiments, it is the sum of a lower_bound on the route lengths of all the nets (e.g., it is the sum of the bounding box of each net).

In some embodiments, $Y_{LI}$ equals 1, while it equals another value (such as $$\frac{1}{T.E.L.}$$

in other embodiments. The multiplier $Y_L$ is a value that is re-computed after the identification of each route at 2535. Hence, each time that the router is identifying (at 2535) a route for a net, the multiplier $Y_L$ is based on all the routes that the router has identified before this iteration of 2535.

The multiplier $Y_j$ is also different in different embodiments. For instance, in some embodiments, this multiplier equals 1 or some other constant. Some embodiments might use different constants for different edges. In other embodiments, this multiplier equals $$\frac{1}{\text{goal}((\text{layer}(j)) * \text{capacity}(j)},$$

where goal(layer(j)) and capacity(j) are defined in Table 2 above. In still other embodiments, this multiplier is represented by the following equation:

$$Y_j = \frac{1}{\overline{C}_L},$$

where $\overline{C}_L$ is the average initial-capacity constant on each layer and is represented by:

$$\overline{C}_L = \frac{1}{\text{Number of Layers}} \sum_{Layers\, L} \left( e^{\left(\frac{\varepsilon_C}{\text{goal}(L)*(\text{Average Planar Edge Capacity on } L)}\right)} - 1 \right).$$

Specifying the multiplier $Y_j$ based on the average initial-capacity cost $\overline{C}_L$ centers the initial capacity costs of the edges about 1.

The multiplier $Y_t$ is also different in different embodiments. For instance, in some embodiments, this multiplier equals to 1 or some other constant. Some embodiments might use different constants for different non-planar edges. In other embodiments, this multiplier equals $$\frac{1}{\text{goal}((\text{layer pairs}(t)) * \text{capacity}(t)},$$

where goal(layer pairs(t)) and capacity(t) are defined in Table 2 above. In still other embodiments, this multiplier is represented by the following equation:

$$Y_j = \frac{1}{\overline{C}_{LP}},$$

where $\overline{C}_{LP}$ is the average initial-capacity constant for each layer pair and is represented by:

$$\overline{C}_{LP} = \frac{1}{\text{Number of Adjacent Layer Pairs}}$$

$$\sum_{\text{Layers Pairs } LP} \left( e^{\left( \frac{\varepsilon_V}{\text{goal}(LP)*(\text{Average Non-Planar Edge Capacity Between } LP)} \right)} - 1 \right).$$

Specifying the multiplier $Y_t$ based on the average initial-capacity constant $\overline{C}_{LP}$ centers the initial capacity costs of the non-planar edges about 1. One of ordinary skill will realize that other embodiments might specify their normalizing constants differently.

In all three components of Equation (A), the base of the exponential expression is the natural-logarithm base e. Other embodiments, however, might use a different base. In addition, other embodiments might formulate differently the exponent of each exponential expression in Equation (A). In some embodiments, the exponential multipliers $\varepsilon_L$, $\varepsilon_C$, $\varepsilon_V$ are real numbers between 2 to 16. For instance, in some embodiments, all three multipliers equal 9, even though these multipliers do not need to be the same value. As mentioned above, each of these multipliers is adjustable by the user in some embodiments.

Each route or path includes a set of node edges, which can be planar or non-planar. The cost of each planar and non-planar node edge was described above in Section I. Table 3 reiterates each of these costs for a route or a path, and describes how each of these costs is factored in each of the components of Equation (A).

TABLE 3

| Node Edge | Wirelength Component | Wire Congestion Component | Via Congestion Component |
| --- | --- | --- | --- |
| Planar Node Edge f on Layers 2 and 3 | Increments length of route or path by unit length cost L. | If edge f goes from one Gcell to another (i.e., crosses a Gcell boundary), then edge f is associated with a congestion edge j, and therefore a new usage(j) is defined by incrementing old usage(j) by one. Otherwise, no effect. | No effect. |
| Planar Node Edge f on Layers 4 and 5 | Increments length of route or path by length cost L * √2. | Define new usage(j) by incrementing old usage(j) by one, where node edge f is associated with congestion edge j. | No effect. |
| Non-Planar Node Edge t between directly overlapping nodes on layers a and b in Gcell g. | Increments length of route or path by length cost X*L, where X is a via-scalar factor. | No effect. | Define new usage(t) by incrementing old usage(t) (associated with vias between layers a and b in Gcell g) by one. |
| Internal Zig t between non-overlapping nodes on layers a and b in Gcell g. | Increments length of route or path by length cost X*L plus L * √2. | No effect. | Define new usage(t) by incrementing old usage(t) (associated with vias between layers a and b in Gcell g) by one. |
| External Zig t between non-overlapping nodes on layers a and b in adjacent Gcells g1 and g2. | Increments length of route or path by length cost X*L plus L * √2. | Use the approach described in Section I.B.3 to associate the instance of the external zig t's use with a congestion edge j. Define new usage(j) by incrementing old usage(j) by one. | Define new usage(t) by increment old usage(t) by one, where old usage(t) is the via usage between layers a and b in the Gcell that is assigned to contain via for this instance of edge t's use, per the approach described above in Section I.B.3. |

One of ordinary skill will realize that other embodiments might use different exponential cost functions than the one illustrated in Equation (A). For instance, some embodiments might use an equation that has the same wire and via congestion components as Equation (A), but the following wirelength component instead of Equation (A)'s wirelength component.

$$\text{Wirelength Component} = Y_{LI} * e^{\varepsilon_L * \frac{\sum_{N=1}^{R} \text{Length}(N)}{T.E.L}} * \text{Length}(d).$$

In this equation, Length(d) is the length of the path p that has reached the expansion's destination node d. Other embodiments might use an equation that uses both this wirelength component and the wirelength component of Equation (A).

2. Deriving Expansion Cost from the G Cost of the Expansion's Start Node

Equation (A) provides a general expression of the costing function that represents the G cost of an expansion in some embodiment. However, in some embodiments, the process 2900 does not actually use Equation (A) to compute the G cost of an expansion. Instead, it derives this G cost from the G cost of the Current_Drop in the following manner.

Assume that the Current_Drop specifies (i.e., is the last drop of) a path p', while the expansion from the Current_Drop specifies a current path p, which is an extension of the path p' to the expansion's destination node. The Current_Drop's G cost, G(Current_Drop), is the cost of the path p' that has reached the Current_Drop.

The process 2900 first computes a $G_1$ cost that is illustrated in Equation (B) below.

$$G_1 = G(\text{Current\_Drop}) + Y_L * \left( e^{\varepsilon_L * \frac{\hat{F}_L(p)}{\hat{H}_{\text{MIN}}}} - e^{\varepsilon_L * \frac{\hat{F}_L(p')}{\hat{H}_{\text{MIN}}}} \right) \quad (B)$$

In this equation, $\hat{F}_L(p)$ equals the length of a path p plus the destination node's $\hat{H}$. It represents an estimated length of a path from a source node through the expansion's destination node d to a target node. It is equivalent to $\hat{F}_L(d)$, which was described above. $\hat{F}_L(p')$ equals the length of a path p' plus the $\hat{H}$ of the expansion's start node. It represents an estimated length of a path from a source node through the expansion's start node to a target node. The remaining terms of Equation (B) are as described above for Equation (A). The exponential expression $$Y_L * e^{\varepsilon_L * \frac{\hat{F}_L(p')}{\hat{H}_{MIN}}}$$

represents the wirelength cost of path p', while the exponential expression $$Y_L * e^{\varepsilon_L * \frac{\hat{F}_L(p)}{\hat{H}_{MIN}}}$$

represents the wirelength cost of path p. Hence, Equation (B) illustrates that the $G_1$ cost can be obtained by adding the incremental wirelength cost for the expansion to the G cost of the Current_Drop, since path p is an extension of path p' by the current expansion.

The length of the path p can be obtained from the length of the path p', as illustrated in Table 4 below.

TABLE 4

| Expansion to Destination Node | Length of Path P |
| --- | --- |
| Planar expansion on layer 2 or 3 | Length of p' plus L, where L is the unit length cost. |
| Planar expansion on layer 4 or 5 | Length of p' plus L * $\sqrt{2}$. |
| Non-planar expansion between overlapping nodes | Length of p' plus X*L, where X is a via-scalar factor. |
| Internal or External Zigs | Length of p' plus (X + $\sqrt{2}$) * L. |

The G cost of the expansion equals the $G_1$ cost expressed in Equation (B) if the expansion is a planar expansion that does not cross a Gcell boundary. However, if the expansion is a planar expansion along a node edge f that crosses a Gcell boundary, and the node edge f is associated with a congestion edge j, then the expansion's G cost is a $G_2$ cost expressed in Equation (C).

$$G_2 = G_1 + Y_j * \left( e^{\varepsilon C * \frac{new\ usage(j)}{goal(layer(j))*capacity(j)}} - e^{\varepsilon C * \frac{old\ usage(j)}{goal(layer(j))*capacity(j)}} \right). \quad (C)$$

As illustrated in this equation, the $G_2$ cost equals the $G_1$ cost expressed in Equation (B) plus an exponential wire congestion cost for crossing the Gcell boundary. In Equation (C), the terms are as defined above. The two exponential terms in Equation (C) represent costs after and before the expansion. Hence, Equation (C) illustrates that the $G_2$ cost can be obtained by adding the incremental wire congestion cost for the expansion to the $G_1$ cost.

If the expansion is along a non-planar edge t between two directly overlapping nodes or is along an internal zig expansion t between two non-overlapping nodes in a Gcell, the expansion's G cost is a $G_3$ cost expressed in Equation (D) below.

$$G_3 = G_1 + \quad (D)$$

-continued $$Y_t * \left( e^{\varepsilon V * \frac{new\ usage(t)}{goal(layer\ pairs(t))*capacity(t)}} - e^{\varepsilon V * \frac{old\ usage(t)}{goal(layer\ pairs(t))*capacity(t)}} \right).$$

As illustrated in this equation, the $G_3$ cost equals the $G_1$ cost expressed in Equation (B) plus exponential via congestion cost due to the via expansion. In Equation (D), the terms are as defined above. The two exponential terms in Equation (D) represent costs after and before the expansion. Hence, Equation (D) illustrates that the $G_3$ cost can be obtained by adding the incremental via congestion cost for the expansion to the $G_1$ cost.

If the expansion is an external zig t that connects two non-overlapping nodes in two adjacent Gcells, the expansion's G cost is a $G_4$ cost expressed in Equation (E) below.

$$G_4 = \quad (E)$$

$$G_1 + Y_j * \left( e^{\varepsilon C * \frac{new\ usage(j)}{goal(layer(j))*capacity(j)}} - e^{\varepsilon C * \frac{old\ usage(j)}{goal(layer(j))*capacity(j)}} \right) +$$

$$Y_t * \left( e^{\varepsilon V * \frac{new\ usage(t)}{goal(layer\ pairs(t))*capacity(t)}} * e^{\varepsilon V * \frac{old\ usage(t)}{goal(layer\ pairs(t))*capacity(t)}} \right).$$

As illustrated in this equation, the $G_4$ cost equals the $G_1$ cost expressed in Equation (B) plus exponential via and wire congestion costs for the via expansion. In Equation (E), the terms are as described above. The two positive exponential terms represent costs after the expansion, while the two negative exponential terms represent costs before the expansion. Hence, Equation (E) illustrates that the $G_4$ cost can be obtained by adding the incremental wire and via congestion costs for the expansion to the $G_1$ cost.

To compute the incremental via and wire congestion costs, the path search process needs to associate this instance of the external zig t's use with a via location and congestion edge, pursuant to the approach described in Section I.B.3. Specifically, the process examines two different via locations and congestion edges for this use of the external zig t, and associates the external zig with the via location and edge crossing that results in the smaller aggregate via and wire congestion costs. The process then uses the incremental via and wire congestion costs of the associated via location and edge crossing in Equation (E) to express the cost of the path p.

For instance, assume that the external zig t is zig 1400 that was described above by reference to FIGS. 14 and 22–24. Assume further that for this instance of external zig t, the smaller aggregate via and wire congestion cost can be obtained by placing the external zig's via in Gcell 1410. Hence, for this use of the external zig, the path search process associates this use of the external zig 1400 with the congestion edge 2310, and specifies the Gcell for the external zig's via as the Gcell 1410. In this situation, the incremental via congestion cost is based on the old and new usage values for vias between layers 4 and 5 in Gcell 1410. The incremental wire congestion cost is based on the old and new usage values for the congestion edge 2310.

C. Generating a Congestion-Unaware Route for a Net

As described above, the process 2500 identifies (at 2520) the congestion-unaware route for each net. To generate the congestion-unaware route for a net, the process can use route-generation and path-generation processes that are similar to the above-described route-generation and path-generation processes 2700 and 2900, except for the costing of expansions at 2940. To generate the congestion-unaware route for a net, some embodiments cost the expansions at 2940 in a non-exponential manner that disregards the via and wire congestion costs and focuses solely on the wirelength cost. For instance, in these embodiments, a planar expansion in layer 2 or 3 has a G cost that equals the Current_Drop's G cost plus a unit length cost L. A planar expansion in layer 4 or 5 has a G cost that equals the Current_Drop's G cost plus L*√2. A non-planar expansion between two overlapping nodes has a G cost that equals the Current_Drop's G cost plus X*L, where X is the via-scaling factor. An internal zig or an external zig expansion has a G cost that equals the Current_Drop's G cost plus (X+√2)* L. Some embodiments disallow expansion on a node edge for which the associated congestion edge has a capacity less than 1.

IV. Computer System

Figure 31:
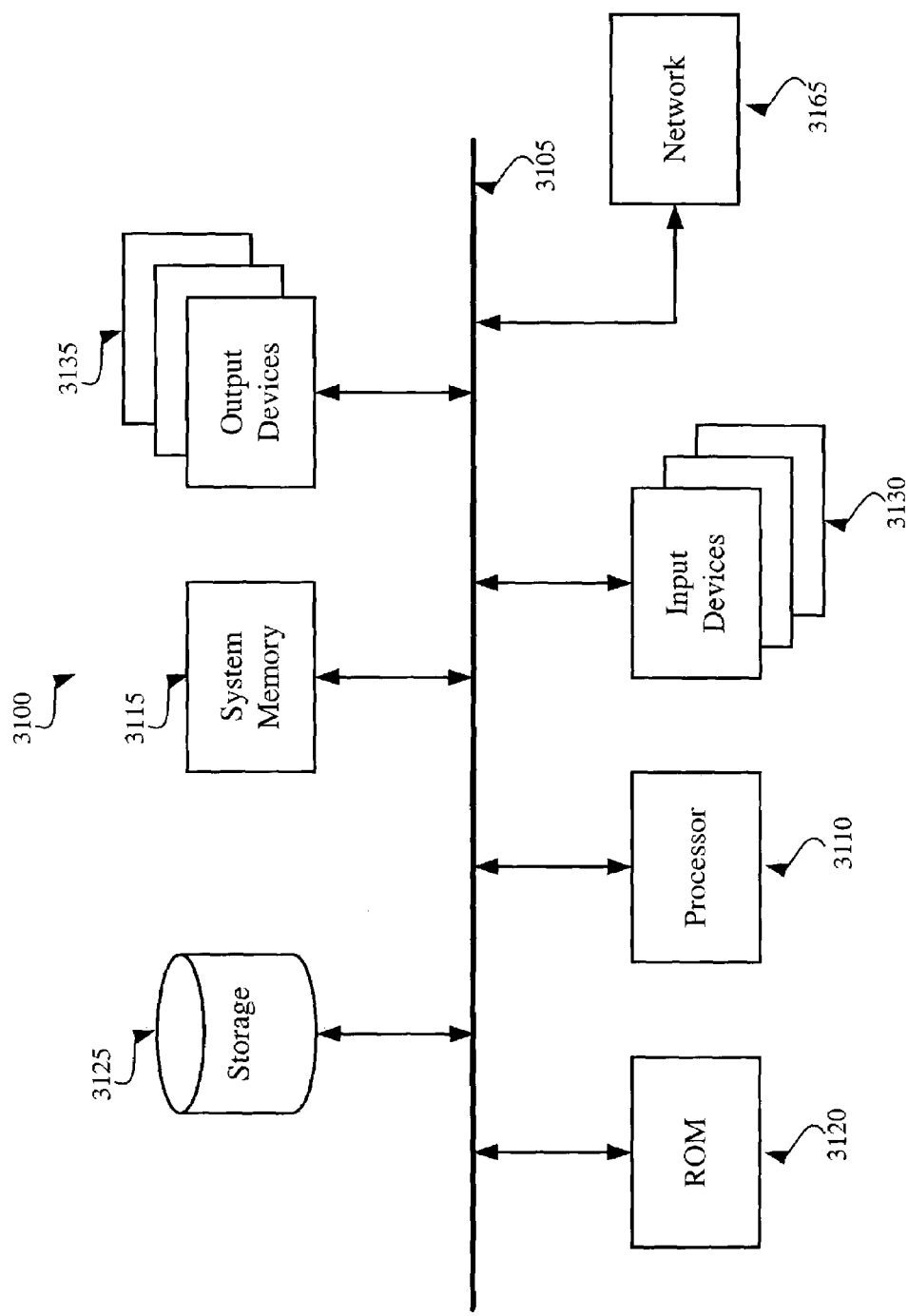
FIG. 31 conceptually illustrates a computer system with which one embodiment of the invention is implemented.

FIG. 31 conceptually illustrates a computer system with which one embodiment of the invention is implemented. Computer system 3100 includes a bus 3105, a processor 3110, a system memory 3115, a read-only memory 3120, a permanent storage device 3125, input devices 3130, and output devices 3035.

The bus 3105 collectively represents all system, peripheral, and chipset buses that support communication among internal devices of the computer system 3100. For instance, the bus 3105 communicatively connects the processor 3110 with the read-only memory 3120, the system memory 3115, and the permanent storage device 3125.

From these various memory units, the processor 3110 retrieves instructions to execute and data to process in order to execute the processes of the invention. The read-only-memory (ROM) 3120 stores static data and instructions that are needed by the processor 3110 and other modules of the computer system. The permanent storage device 3125, on the other hand, is a read-and-write memory device. This device is a non-volatile memory unit that stores instruction and data even when the computer system 3100 is off. Some embodiments of the invention use a mass-storage device (such as a magnetic or optical disk and its corresponding disk drive) as the permanent storage device 3125. Other embodiments use a removable storage device (such as a floppy disk or zip® disk, and its corresponding disk drive) as the permanent storage device.

Like the permanent storage device 3125, the system memory 3115 is a read-and-write memory device. However, unlike storage device 3125, the system memory is a volatile read-and-write memory, such as a random access memory. The system memory stores some of the instructions and data that the processor needs at runtime. In some embodiments, the invention's processes are stored in the system memory 3115, the permanent storage device 3125, and/or the read-only memory 3120.

The bus 3105 also connects to the input and output devices 3130 and 3135. The input devices enable the user to communicate information and select commands to the computer system. The input devices 3130 include alphanumeric keyboards and cursor-controllers. The output devices 3135 display images generated by the computer system. For instance, these devices display IC design layouts. The output devices include printers and display devices, such as cathode ray tubes (CRT) or liquid crystal displays (LCD).

Finally, as shown in FIG. 31, bus 3105 also couples computer 3100 to a network 3165 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3100 may be used in conjunction with the invention. However, one of ordinary skill in the art will appreciate that any other system configuration may also be used in conjunction with the invention.

Figure 32:
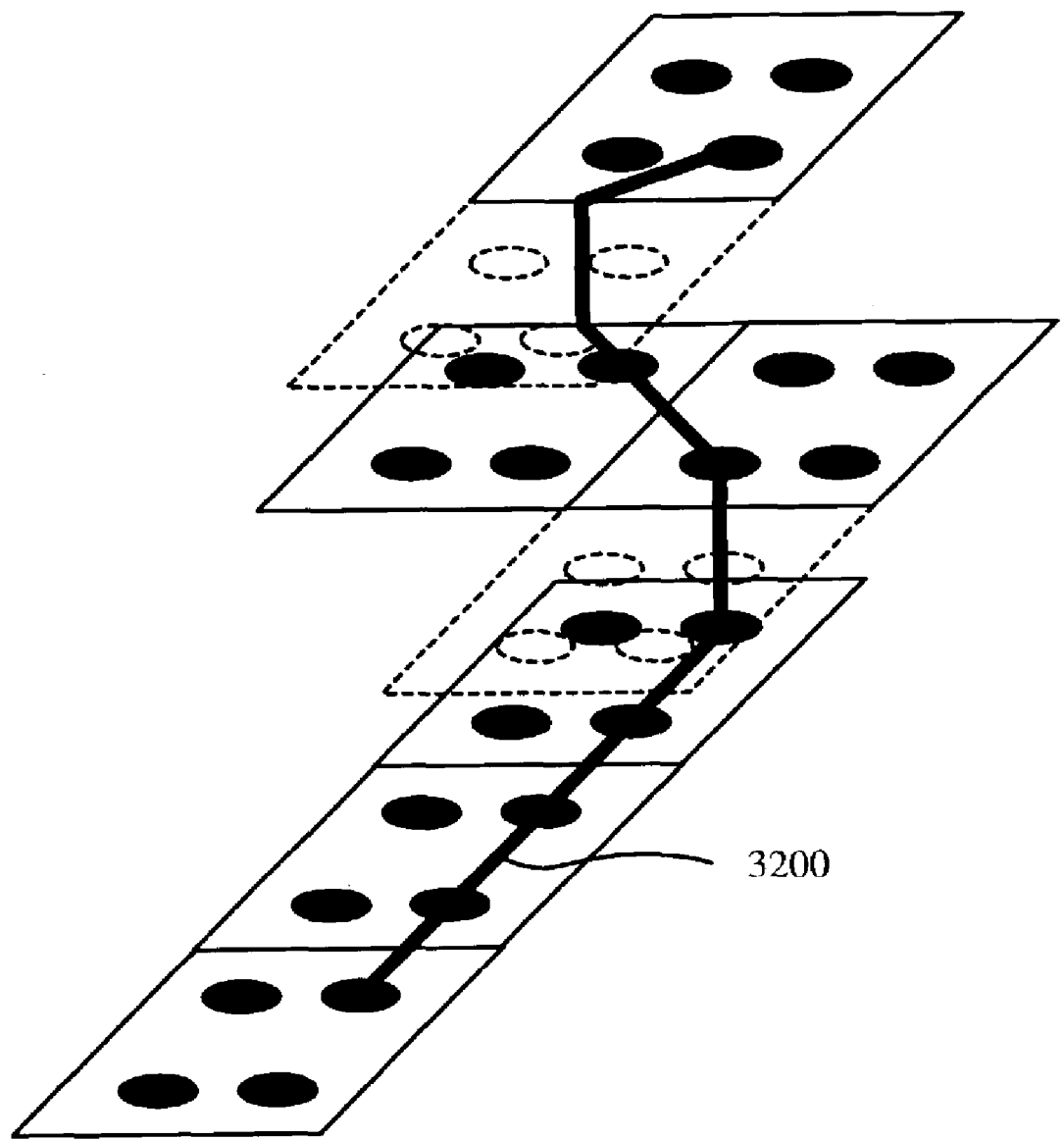
FIG. 32 illustrates an example of a multi-layer global route that is produced by a router of some embodiments of the invention.

The above-described router can produce multi-layer global routes that have horizontal, vertical, and diagonal edges. FIG. 32 provides an example of one such global route. This route 3200 traverses layers 3, 4, and 5. As shown in this figure, this route includes a via between layers 3 and 4, and an external zig via between layers 4 and 5.

While the invention has been described with reference to numerous specific details, one of ordinary skill in the art will recognize that the invention can be embodied in other specific forms without departing from the spirit of the invention. For instance, even though the router described above is a flat global router, one of ordinary skill will realize that the invention can be practiced with hierarchical routers, such as a router described in U.S. patent application Ser. No. 10/013,819, filed on Dec. 7, 2001.

Also, the routes and paths described above are defined with respect to the node edges illustrated in FIGS. 4 through 7. These routes and paths, however, can be defined differently. For instance, they can be defined with respect to a set of edges that are orthogonal to the edges illustrated in FIGS. 4 through 7.

In addition, many aspects of the invention can be practiced without the congestion and length grids illustrated in FIGS. 1 and 2. Alternatively, they can be practiced with different congestion and length grids, or different structures for these grids. For instance, in some embodiments, intersecting horizontal and vertical lines might not form one or both these grids. Also, nodes might not be defined in the center of the length-grid sub-regions.

Although the router described above uses horizontal, vertical, and ±45 diagonal wiring, many aspects of the invention can be practiced with a different set of interconnect lines. Also, some embodiments might use costing equations that are different than those described in Equations (A)–(E) above. For instance, some embodiments described above express the wirelength cost of a path p as $$Y_L * e^{\varepsilon_L * \frac{\hat{F}_L(p)}{\hat{H}_{MIN}}}.$$

Some embodiments might express such a path cost as $$Y_L * e^{\varepsilon_L * \frac{\hat{F}_L(p)}{B * \hat{H}_{MIN}}},$$

where B is a factor related to the importance of the net. This factor B is smaller (e.g., it is 1) for important time-critical nets that need shorter routes, while it is larger (e.g., it is 3) for non-critical nets that can have longer routes. Accordingly, this factor causes the path search to try to identify shorter paths for critical nets, by increasing the wirelength cost of these nets much faster during path searches than the wirelength cost of non-critical nets. Other embodiments might use other exponential and non-exponential expressions in their cost functions. Thus, one of ordinary skill in the art would understand that the invention is not to be limited by the foregoing illustrative details, but rather is to be defined by the appended claims.

We claim:

1. A method of defining global routes for nets in a region of a layout with multiple layers, the method comprising:

a) defining a three dimensional routing graph that has a plurality of nodes on a plurality of layers, wherein each node represents a sub-region on a layer, wherein a set of edges exists between the nodes on each layer, wherein a set of edges on one layer are neither orthogonal nor parallel to a set of edges on another layer, wherein defining the three dimensional routing graph comprises partitioning each layer into a plurality of sub-regions; wherein using the three dimensional routing graph comprises identifying, for each net, a route that connects the sub-regions that contain the net's set of routable elements, wherein some of the routes traverse along edges that are neither orthogonal nor parallel to each other; and b) using the three dimensional routing graph to identify global routes within said region.

2. The method of claim 1, wherein each edge connects two sub-regions, wherein some edges are non-Manhattan edges.

3. The method of claim 2, wherein some edges are Manhattan edges.

4. The method of claim 3, wherein identifying the route for a net comprises performing at least one path search that explores planar path expansions on at least one layer and non-planar path expansions between the layers in order to identify a segment of the route.

5. The method of claim 4, wherein performing the path search comprises:

a) specifying source and target sets;
   b) identifying the start of at least one path;
   c) iteratively identifying a set of expansions about previously identified paths until identifying a path that connects the source and target sets, wherein the identified path is the segment of the route, wherein each expansion is from one sub-region to another, wherein some expansions are along planar Manhattan directions, some expansions are along planar non-Manhattan directions, and some expansions are along non-planar directions.

6. The method of claim 1, wherein some of the edges are Manhattan edges while other edges are non-Manhattan edges, wherein the non-Manhattan edges are on different layers than the Manhattan edges.

7. The method of claim 6,
   wherein defining the three dimensional routing graph comprises partitioning each layer into a first set of sub-regions and partitioning the region into a second set of sub-regions;
   wherein the edges exist between the first-set sub-regions.

8. The method of claim 7, wherein a set of non-planar edges exist between first-set sub-regions on different layers.

9. The method of claim 8, wherein each second-set sub-region includes a plurality of first-set sub-regions, wherein at least some non-planar edges are between first-set sub-regions that are in the same second-set sub-region.

10. The method of claim 8, wherein each second-set sub-region includes a plurality of first-set sub-regions, wherein at least some non-planar edges are between first-set sub-regions that are in different second-set sub-regions.

11. The method of claim 7, wherein the non-Manhattan edges include a first set of non-Manhattan edges on a first layer and a second set of non-Manhattan edges on a second layer, wherein the first set of non-Manhattan edges do not include an edge between each pair of first-set sub-regions that are adjacent in the direction of the first-set edges on the first layer, and the second set of non-Manhattan edges do not include an edge between each pair of second-set sub-regions that are adjacent in the direction of the second-set edges on the second layer.

12. The method of claim 11, wherein the first layer is a fourth wiring layer, the second layer is a fifth wiring layer, and the first and second sets of non-Manhattan edges are ±45° edges.

13. The method of claim 1, wherein using the three dimensional routing graph comprises embedding routes in the three dimensional routing graph.

14. A three dimensional global routing graph that represents a region of a multi-layer layout, the three dimensional global routing graph comprising:

a) a plurality of nodes on a plurality of layers, wherein each node represents a sub-region on a layer; and
   b) a set of edges existing between the nodes on each layer, wherein a set of edges on one layer are neither orthogonal nor parallel to a set of edges on another layer,
   wherein the three dimensional global routing graph is for defining global routes that connect nodes representing sub-regions on a layer within said region.

15. The three dimensional routing graph of claim 14, wherein some edges are Manhattan edges and some are non-Manhattan edges.

16. The three dimensional routing graph of claim 15, wherein the non-Manhattan edges are on different layers than the Manhattan edges.

17. The three dimensional routing graph of claim 14 further comprising a set of non-planar edges exist between nodes on different layers.

18. The three dimensional routing graph of claim 17 further comprising a plurality of Gcells, wherein each Gcell includes a plurality of nodes on a plurality of layers, wherein at least some non-planar edges are between nodes that are in the same Gcell.

19. The three dimensional routing graph of claim 7 further comprising a plurality of Gcells, wherein each Gcell includes a plurality of nodes on a plurality of layers, wherein at least some non-planar edges are between nodes that are in different Gcells.

20. The three dimensional routing graph of claim 16, wherein the non-Manhattan edges include a first set of non-Manhattan edges on a first layer and a second set of non-Manhattan edges on a second layer, wherein the first set of non-Manhattan edges do not include an edge between each pair of first-set sub-regions that are adjacent in the direction of the first-set edges on the first layer, and the second set of non-Manhattan edges do not include an edge between each pair of second-set sub-regions that are adjacent in the direction of the second-set edges on the second layer.

21. A computer readable medium that stores a computer program for defining global routes for nets in a region of a layout with multiple layers, the computer program comprising sets of instructions for:

a) defining a three dimensional routing graph that has a plurality of nodes on a plurality of layers, wherein each node represents a sub-region on a layer, wherein a set of edges exists between the nodes on each layer, wherein a set of edges on one layer are neither orthogonal nor parallel to a set of edges on another layer, wherein defining the three dimensional routing graph comprises partitioning each layer into a plurality of sub-regions; wherein using the three dimensional routing graph comprises identifying, for each net, a route that connects the sub-regions that contain the net's set of routable elements, wherein some of the routes traverse along edges that are neither orthogonal nor parallel to each other; and b) using the three dimensional routing graph to identify global routes within said region.

22. The computer readable medium of claim 21, wherein each edge connects two sub-regions, wherein some edges are non-Manhattan edges.

23. The computer readable medium of claim 22, wherein some edges are Manhattan edges.

24. The computer readable medium of claim 21, wherein some of the edges are Manhattan edges while other edges are non-Manhattan edges, wherein the non-Manhattan edges are on different layers than the Manhattan edges.

25. The computer readable medium of claim 24,
wherein the set of instructions for defining the three dimensional routing graph comprises a set of instructions for partitioning each layer into a first set of sub-regions and partitioning the region into a second set of sub-regions;
wherein the edges exist between the first-set sub-regions.

26. The computer readable medium of claim 25, wherein a set of non-planar edges exist between first-set sub-regions on different layers.

27. The computer readable medium of claim 26, wherein each second-set sub-region includes a plurality of first-set sub-regions, wherein at least some non-planar edges are between first-set sub-regions that are in the same second-set sub-region.

28. The computer readable medium of claim 26, wherein each second-set sub-region includes a plurality of first-set sub-regions, wherein at least some non-planar edges are between first-set sub-regions that are in different second-set sub-regions.

29. The computer readable medium of claim 25, wherein the non-Manhattan edges include a first set of non-Manhattan edges on a first layer and a second set of non-Manhattan edges on a second layer, wherein the first set of non-Manhattan edges do not include an edge between each pair of first-set sub-regions that are adjacent in the direction of the first-set edges on the first layer, and the second set of non-Manhattan edges do not include an edge between each pair of second-set sub-regions that are adjacent in the direction of the second-set edges on the second layer.

30. The computer readable medium of claim 29, wherein the first layer is a fourth wiring layer, the second layer is a fifth wiring layer, and the first and second sets of non-Manhattan edges are ±45° edges.

* * * * *

UNITED STATES PATENT AND TRADEMARK OFFICE
CERTIFICATE OF CORRECTION

PATENT NO. : 7,003,752 B2 Page 1 of 1
APPLICATION NO. : 10/335093
DATED : February 21, 2006
INVENTOR(S) : Steven Teig et al.

It is certified that error appears in the above-identified patent and that said Letters Patent is hereby corrected as shown below:

Claim 19,
Column 30, Line 44, "The three dimensional routing graph of claim 7 further"

should read -- The three dimensional routing graph of claim 17 further --

Signed and Sealed this

Seventh Day of November, 2006

JON W. DUDAS
*Director of the United States Patent and Trademark Office*